(12) United States Patent
Yu et al.

(10) Patent No.: US 12,261,142 B2
(45) Date of Patent: Mar. 25, 2025

(54) SEMICONDUCTOR STRUCTURE INCLUDING THERMAL ENHANCED BONDING STRUCTURE

(71) Applicant: Taiwan Semiconductor Manufacturing Company, Ltd., Hsinchu (TW)

(72) Inventors: Chen-Hua Yu, Hsinchu (TW); Chun-Hui Yu, Hsinchu County (TW); Jeng-Nan Hung, Taichung (TW); Kuo-Chung Yee, Taoyuan (TW); Po-Fan Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/489,016

(22) Filed: Oct. 18, 2023

(65) Prior Publication Data
US 2024/0047404 A1 Feb. 8, 2024

Related U.S. Application Data

(63) Continuation of application No. 17/834,923, filed on Jun. 7, 2022, now Pat. No. 11,830,844, which is a continuation of application No. 16/935,175, filed on Jul. 21, 2020, now Pat. No. 11,380,645.

(60) Provisional application No. 62/940,257, filed on Nov. 26, 2019.

(51) Int. Cl.
*H01L 23/00* (2006.01)
*H01L 23/48* (2006.01)

(52) U.S. Cl.
CPC .......... *H01L 24/20* (2013.01); *H01L 23/481* (2013.01); *H01L 2224/2101* (2013.01); *H01L 2224/214* (2013.01); *H01L 2224/215* (2013.01)

(58) Field of Classification Search
CPC . H01L 2224/08145; H01L 2224/08146; H01L 23/481; H01L 21/76898
See application file for complete search history.

(56) References Cited

U.S. PATENT DOCUMENTS

| | | | |
|---|---|---|---|
| 9,000,584 | B2 | 4/2015 | Lin et al. |
| 9,048,222 | B2 | 6/2015 | Hung et al. |
| 9,048,233 | B2 | 6/2015 | Wu et al. |
| 9,064,879 | B2 | 6/2015 | Hung et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,368,460 | B2 | 6/2016 | Yu et al. |

(Continued)

*Primary Examiner* — Mamadou L Diallo
(74) *Attorney, Agent, or Firm* — JCIPRNET

(57) ABSTRACT

A structure including a first semiconductor die and a second semiconductor die is provided. The first semiconductor die includes a first bonding structure. The first bonding structure includes a first dielectric layer and first conductors embedded in the first dielectric layer. The second semiconductor die includes a second bonding structure. The second bonding structure includes a second dielectric layer and second conductors embedded in the second dielectric layer. The first dielectric layer is in contact with the second dielectric layer, and the first conductors are in contact with the second conductors. Thermal conductivity of the first dielectric layer and the second dielectric layer is greater than thermal conductivity of silicon dioxide.

20 Claims, 22 Drawing Sheets

(56) References Cited

U.S. PATENT DOCUMENTS

| | | | |
|---|---|---|---|
| 9,372,206 B2 | 6/2016 | Wu et al. | |
| 9,496,189 B2 | 11/2016 | Yu et al. | |
| 10,672,820 B2* | 6/2020 | Tsai | H01L 24/06 |
| 10,797,062 B1* | 10/2020 | Nishikawa | H01L 25/0657 |
| 2006/0121710 A1* | 6/2006 | Liang | H01L 29/41766 |
| | | | 257/E21.546 |
| 2010/0187670 A1* | 7/2010 | Lin | H01L 23/3677 |
| | | | 257/E23.101 |
| 2015/0021785 A1* | 1/2015 | Lin | H01L 21/76897 |
| | | | 438/459 |
| 2015/0221591 A1* | 8/2015 | Holmes | H01L 23/528 |
| | | | 257/769 |
| 2018/0005916 A1* | 1/2018 | Chen | H01L 23/3675 |
| 2020/0266146 A1* | 8/2020 | Nishida | H01L 23/5383 |
| 2020/0350322 A1* | 11/2020 | Liu | H10B 12/50 |
| 2021/0066224 A1* | 3/2021 | Jang | H01L 27/14627 |
| 2021/0118827 A1* | 4/2021 | Chen | H01L 24/09 |
| 2021/0134747 A1* | 5/2021 | Yang | H01L 25/50 |
| 2022/0278078 A1* | 9/2022 | Shih | H01L 25/0657 |

\* cited by examiner

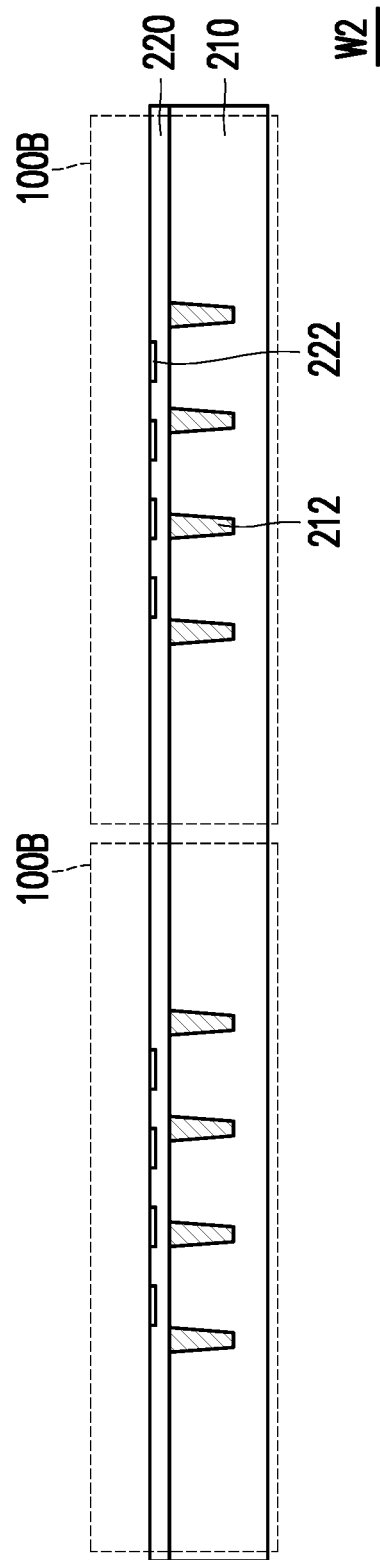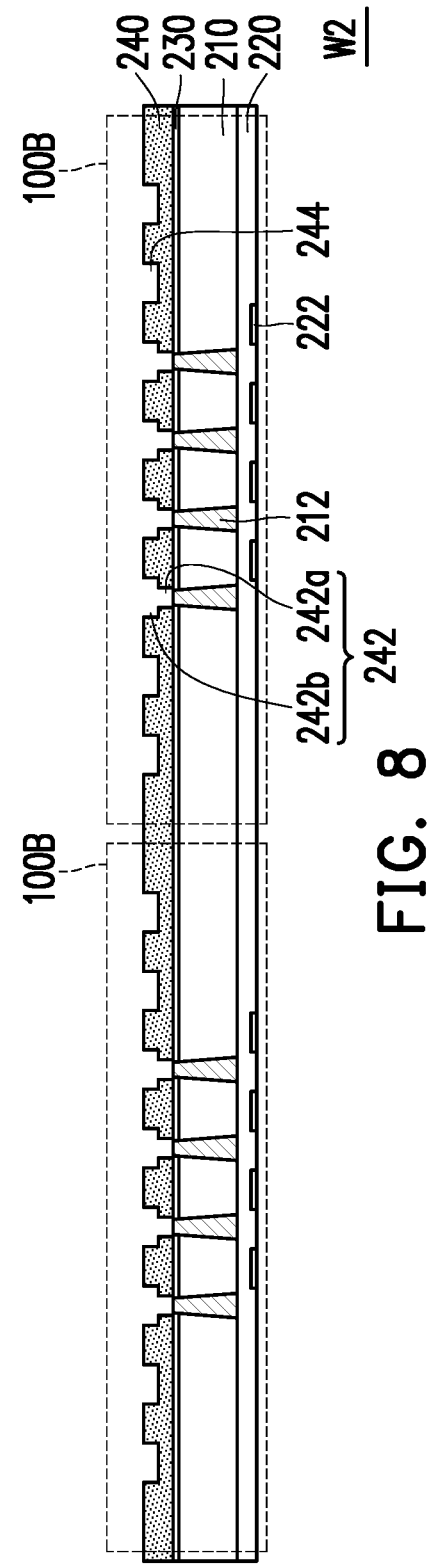

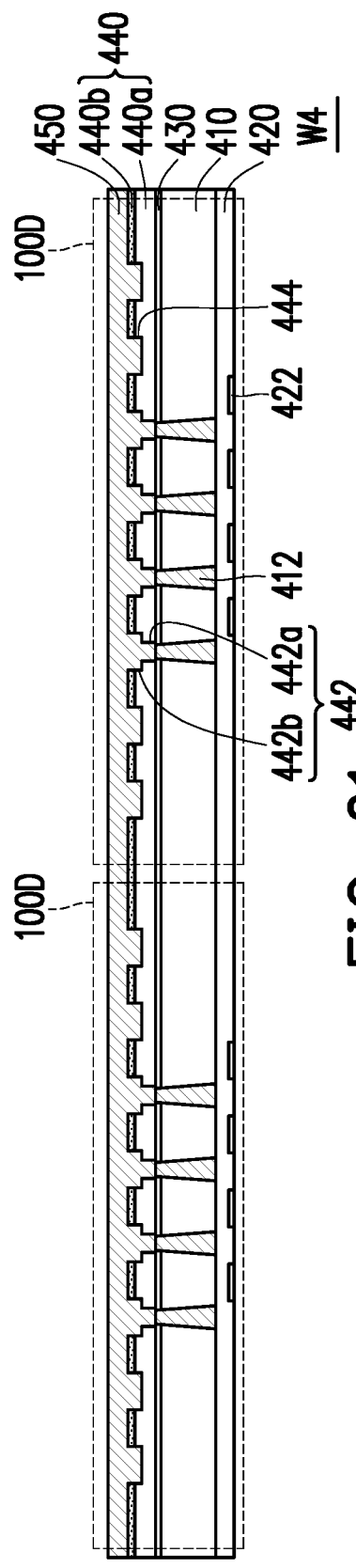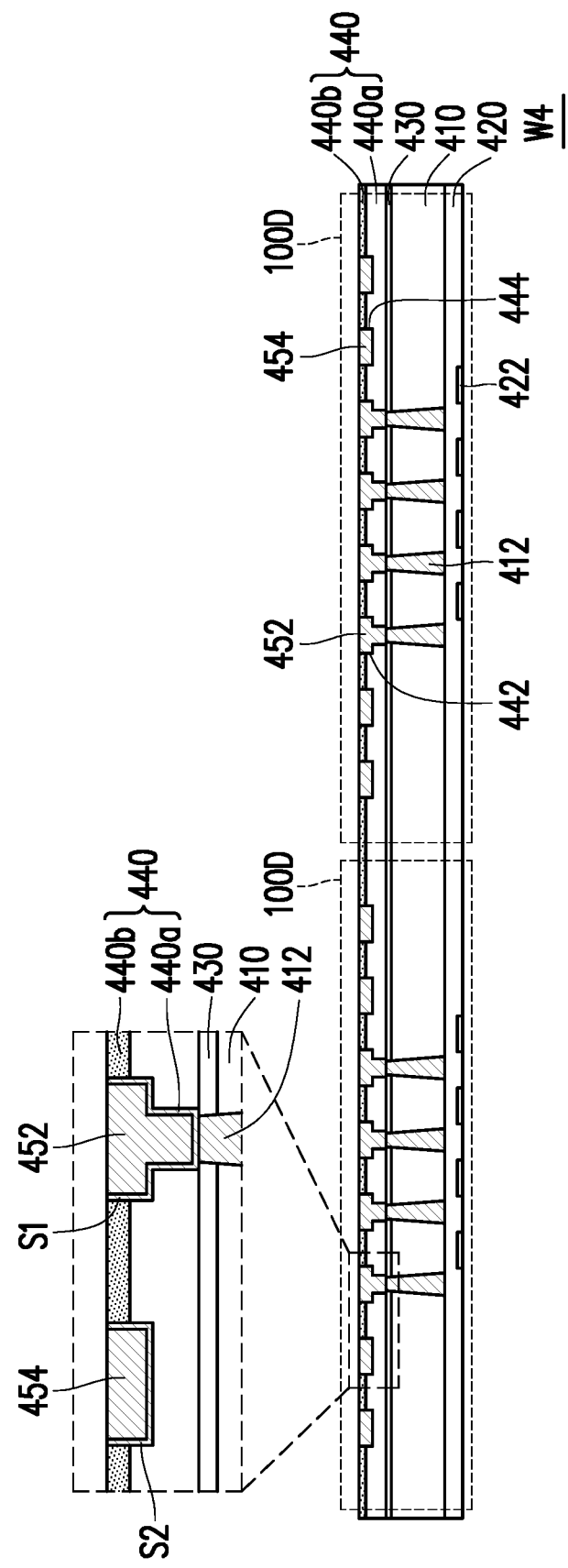
FIG. 21
FIG. 22

SEMICONDUCTOR STRUCTURE INCLUDING THERMAL ENHANCED BONDING STRUCTURE

CROSS-REFERENCE TO RELATED APPLICATION

This application is a continuation application of and claims the priority benefit of a prior application Ser. No. 17/834,923 filed on Jun. 7, 2022 and now allowed. The prior application Ser. No. 17/834,923 is a continuation application of and claims the priority benefit of a prior application Ser. No. 16/935,175, filed on Jul. 21, 2020, and now issued as U.S. Pat. No. 11,380,645. The prior application Ser. No. 16/935,175 claims the priority benefit of U.S. provisional application Ser. No. 62/940,257, filed on Nov. 26, 2019. The entirety of each of the above-mentioned patent applications is hereby incorporated by reference herein and made a part of this specification.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed and greater bandwidth, as well as lower power consumption and latency has grown recently, there has grown a need for smaller and more creative packaging techniques of semiconductor dies. Currently, System-on-Integrated-Circuit (SoIC) components are becoming increasingly popular for their multi-functions and compactness. However, there are challenges related to the SoIC components.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7 through FIG. 12 are cross-sectional views schematically illustrating a process flow for fabricating a semiconductor die in accordance with other embodiments of the present disclosure.

FIG. 19 through FIG. 24 are cross-sectional views schematically illustrating a process flow for fabricating a semiconductor die in accordance with some alternative embodiments of the present disclosure.

DETAILED DESCRIPTION

Figure 1:
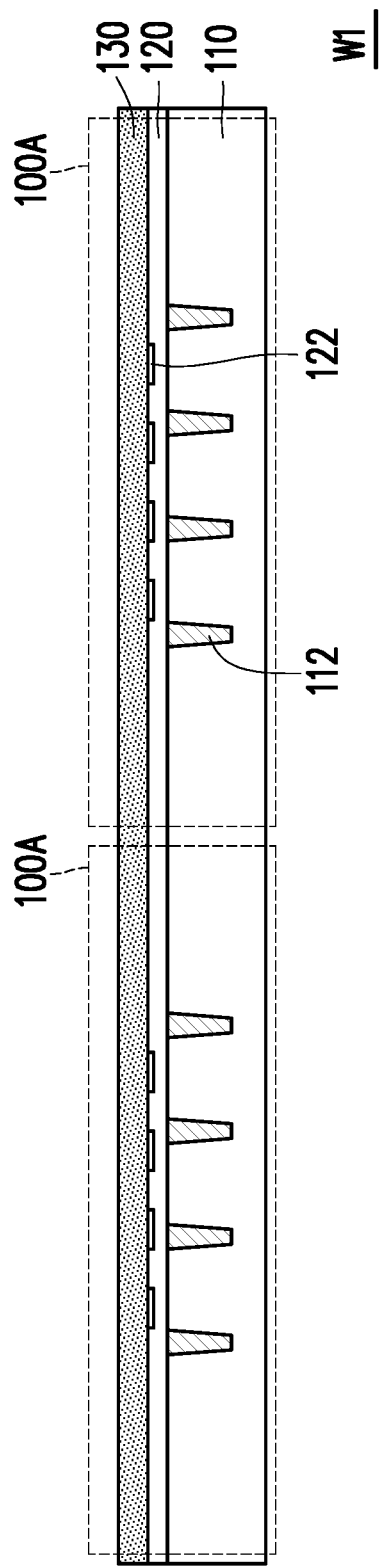
FIG. 1 through FIG. 6 are cross-sectional views schematically illustrating a process flow for fabricating a semiconductor die in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 through FIG. 6 are cross-sectional views schematically illustrating a process flow for fabricating a semiconductor die in accordance with some embodiments of the present disclosure.

Referring to FIG. 1, a semiconductor wafer W1 including semiconductor dies 100A arranged in array is provided. The semiconductor wafer W1 may include a semiconductor substrate 110, an interconnect structure 120 disposed on the semiconductor substrate 110 and a bonding dielectric layer 130 covering the interconnect structure 120. The semiconductor substrate 110 may be a silicon substrate including active components (e.g., transistors or the like) and passive components (e.g., resistors, capacitors, inductors, or the like) formed therein. The active components and passive components are formed in the semiconductor substrate 110 through front end of line (FEOL) fabrication processes of the semiconductor wafer W1. The semiconductor substrate 110 may further include through semiconductor vias (TSVs) 112, wherein the through semiconductor vias 112 are electrically connected to the interconnect structure 120. The through semiconductor vias 112 may be embedded in the semiconductor substrate 110, and the height of the through semiconductor vias 112 is less than the thickness of the semiconductor substrate 110. The interconnect structure 120 may include interconnect wirings (e.g., copper interconnect wirings) and dielectric layer stacked alternately, wherein the interconnect wirings of the interconnect structure 120 are electrically connected to the active components and/or the passive components in the semiconductor substrate 110. The interconnect structure 120 is formed through back end of line (BEOL) fabrication processes of the semiconductor wafer W1. The topmost interconnect wirings may include conductive pads 122, and the conductive pads 122 may be aluminum pads, copper pads, or other suitable metallic pads. In some embodiments, although not illustrated in FIG. 1, at least portions of the through semiconductor vias 112 are electrically connected to the conductive pads through interconnect wirings in the interconnect structure 120. The interconnect structure 120 may further include a passivation layer (not shown), wherein the conductive pads 122 are partially covered by the passivation layer. In other words, the conductive pads 122 are partially revealed from the openings defined in the passivation layer. The passivation layer may be a silicon oxide layer, a silicon nitride layer, a silicon oxy-nitride layer, or a dielectric layer formed by other suitable inorganic dielectric materials. The interconnect structure 120 may further include a post-passivation layer (not shown) formed over the passivation layer, wherein the post-passivation layer covers the passivation layer and the conductive pads 122, the post-passivation layer includes a plurality of contact openings, and the conductive pads 122 are partially revealed from the contact openings defined in the post passivation layer. The post-passivation layer may be a polyimide (PI) layer, a PBO layer, or a dielectric layer formed by other suitable organic dielectric materials. In some embodiments, the post-passivation layer is omitted.

The bonding dielectric layer 130 may be a dielectric layer having thermal conductivity greater than that of silicon dioxide formed by any growth or deposition process. For example, the thermal conductivity of the bonding dielectric layer 130 is greater than about 1.4 W/mK. The bonding dielectric layer 130 may be a diamond like carbon (DLC) layer or other suitable dielectric layers having thermal conductivity greater than about 1.4 W/mK. For example, the thermal conductivity of the DLC layer 130 is greater than 20 W/mK.

Figure 2:
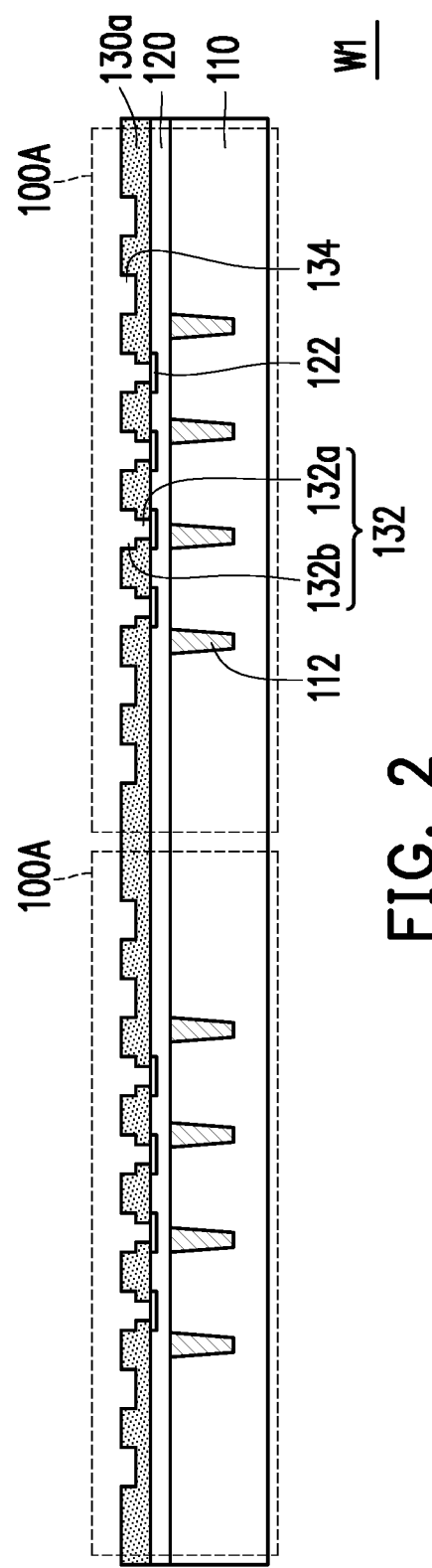

Referring to FIG. 1 and FIG. 2, a patterning process of the bonding dielectric layer 130 is performed. At least one photolithography process followed by at least one etching process may be performed to pattern the bonding dielectric layer 130 such that a patterned bonding dielectric layer 130a is formed over the interconnect structure 120. The patterned bonding dielectric layer 130a may include openings 132 and trenches 134, wherein the conductive pads 122 are partially revealed by the openings 132 defined in the patterned bonding dielectric layer 130a. As illustrated in FIG. 2, the openings 132 may each include a via 132a and a trench 132b located above the via 132a, wherein the trenches 132b and the trenches 134 may be formed by a first photolithography process followed by a first etching process, while the vias 132a may be formed by a second photolithography process followed by a second etching process. The profile of the openings 132 and the trenches 134 defined in the patterned bonding dielectric layer 130a may be modified in accordance with design rule.

Figure 3:
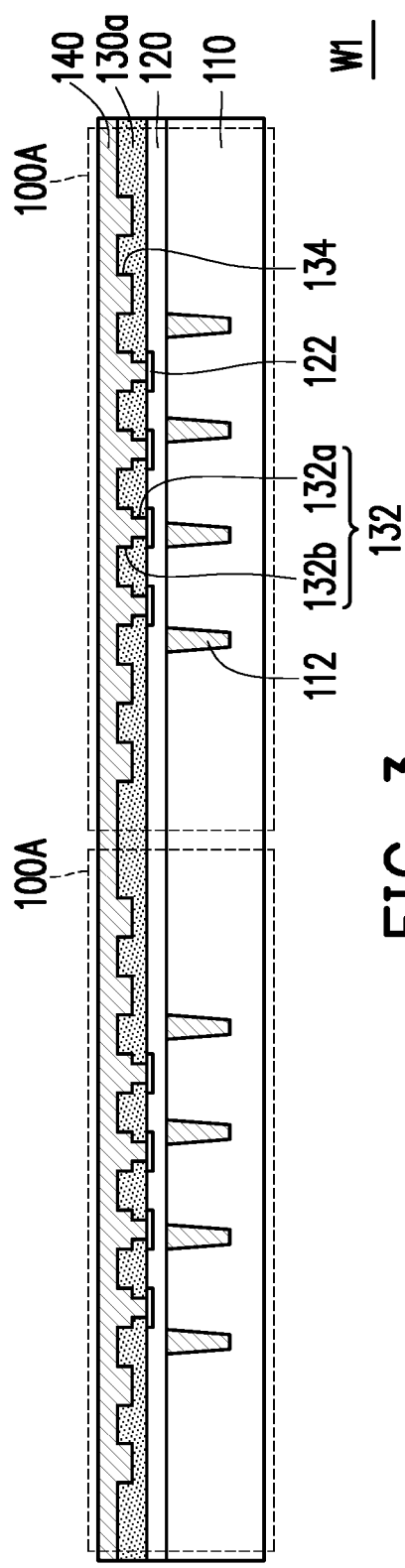

Referring to FIG. 2 and FIG. 3, a conductive material layer 140 is formed to cover the patterned bonding dielectric layer 130a. For example, the material of the conductive material layer 140 includes copper or other suitable metallic materials. The conductive material layer 140 fills into the openings 132 and the trenches 134 defined in the patterned bonding dielectric layer 130a and covers a top surface of the patterned bonding dielectric layer 130a. In some embodiments, a seed layer (e.g., sputtered Ti/Cu seed layer) is formed on the patterned bonding dielectric layer 130a and revealed portions of the conductive pads 122 through a sputtering process, and at least one plating process is then performed such that the conductive material layer 140 is plated on the sputtered seed layer.

Figure 4:
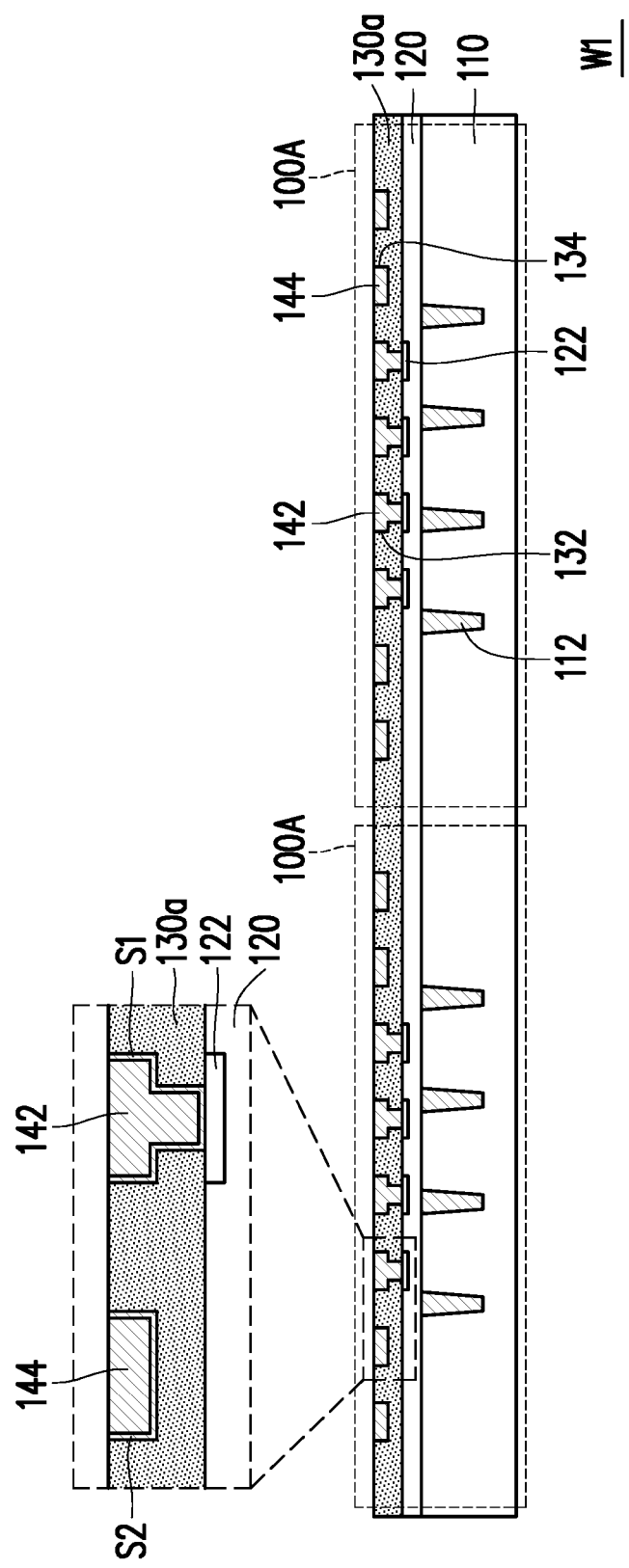

Referring to FIG. 3 and FIG. 4, a grinding process may be performed to remove a portion of the conductive material layer 140 until the top surface of the patterned bonding dielectric layer 130a is revealed. After performing the grinding process of the conductive material 140, bonding conductors 142 filled in the openings 132 and bonding conductors 144 filled in the trenches 134 are formed. The grinding process may be a chemical mechanical polish (CMP) process, a mechanical grinding process or combinations thereof. As illustrated in FIG. 4, top surfaces of the bonding conductors 142 and 144 may be substantially leveled with the top surface of the patterned bonding dielectric layer 130a. In some other embodiments, the top surfaces of the bonding conductors 142 and 144 are slightly lower or slightly higher than the top surface of the patterned bonding dielectric layer 130a due to grinding selectivity.

In some embodiments where the conductive material layer 140 is formed on a sputtered seed layer (e.g., sputtered Ti/Cu seed layer) by a plating process, a portion of the conductive material layer 140 and portions of the sputtered seed layer formed on the top surface of the patterned bonding dielectric layer 130a are removed through the grinding process until the top surface of the patterned bonding dielectric layer 130a is revealed. After performing the grinding process, the bonding conductors 142 are spaced apart from the patterned bonding dielectric layer 130a by sputtered seed patterns S1, the bonding conductors 142 are spaced apart from the conductive pads 122 by the sputtered seed patterns S1, and the bonding conductors 144 are spaced apart from the patterned bonding dielectric layer 130a by sputtered seed patterns S2.

In some embodiments, as illustrated in FIG. 2 through FIG. 4, a dual damascene process is performed to form the bonding conductors 142 and 144 embedded in the patterned bonding dielectric layer 130a. In some alternative embodiments, a single damascene process is performed to form the bonding conductors embedded in the patterned bonding dielectric layer.

Figure 5:
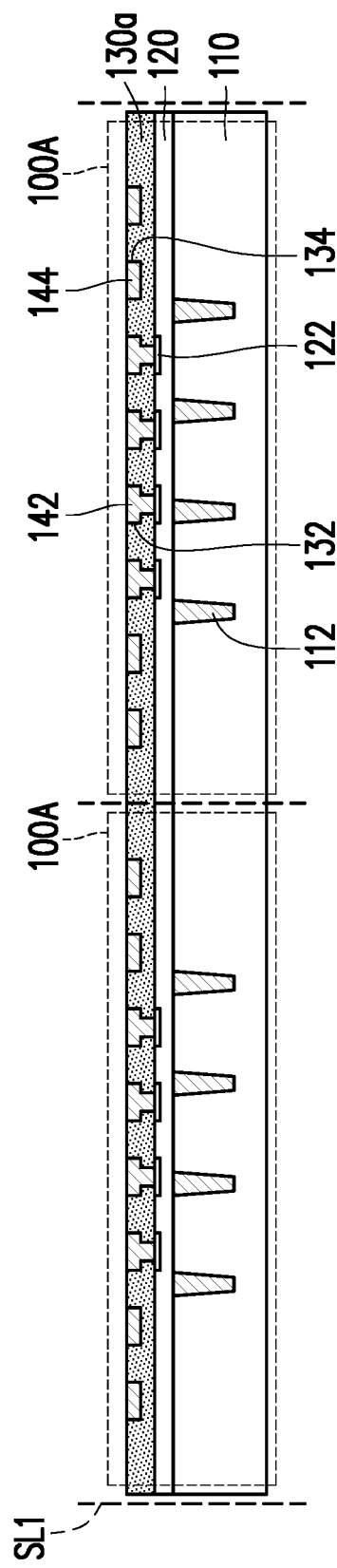
Figure 6:
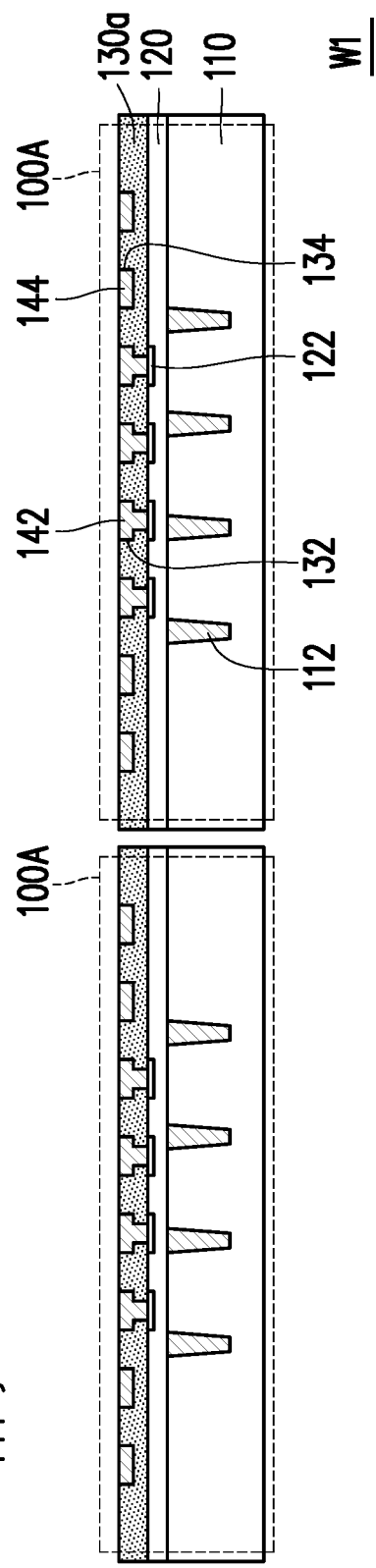

Referring to FIG. 5 and FIG. 6, a wafer sawing process is performed along the scribe lines SL1 of the semiconductor wafer W1 to singulate the semiconductor wafer W1 such that singulated semiconductor dies 100A are obtained. The semiconductor die 100A includes a semiconductor substrate 110, an interconnect structure 120 disposed on the semiconductor substrate 110, and a bonding structure BS1 disposed on the interconnect structure 120. The bonding structure BS1 may include a patterned bonding dielectric layer 130a and bonding conductors 142 and 144 embedded in the patterned bonding dielectric layer 130a.

Since the bonding structure BS1 includes the patterned bonding dielectric layer 130a with high thermal conductivity (e.g., greater than about 1.4 W/mK), heat dissipation performance of the singulated semiconductor dies 100A is enhanced.

FIG. 7 through FIG. 12 are cross-sectional views schematically illustrating a process flow for fabricating a semiconductor die in accordance with other embodiments of the present disclosure.

Referring to FIG. 7, a semiconductor wafer W2 including semiconductor dies 100B arranged in array is provided. The semiconductor wafer W2 may include a semiconductor substrate 210 and an interconnect structure 220 disposed on the semiconductor substrate 210. The semiconductor substrate 210 may be a silicon substrate including active components (e.g., transistors or the like) and passive components (e.g., resistors, capacitors, inductors, or the like) formed therein. The active components and passive components are formed in the semiconductor substrate 210 through front end of line (FEOL) fabrication processes of the semiconductor wafer W2. The semiconductor substrate 210 may further include through semiconductor vias (TSVs) 212, wherein the through semiconductor vias 212 are electrically connected to the interconnect structure 220. The through semiconductor vias 212 may be embedded in the semiconductor substrate 210, and the height of the through semiconductor vias 212 is less than the thickness of the semiconductor substrate 210. The interconnect structure 220 may include interconnect wirings (e.g., copper interconnect wirings) and dielectric layer stacked alternately, wherein the interconnect wirings of the interconnect structure 220 are electrically connected to the active components and/or the passive components in the semiconductor substrate 210. The interconnect structure 220 is formed through back end of line (BEOL) fabrication processes of the semiconductor wafer W2. The topmost interconnect wirings may include conductive pads 222, and the conductive pads 222 may be aluminum pads, copper pads, or other suitable metallic pads. The interconnect structure 220 may further include a passivation layer (not shown), wherein the conductive pads 222 are partially covered by the passivation layer. In other words, the conductive pads 222 are partially revealed from the openings defined in the passivation layer. The passivation layer may be a silicon oxide layer, a silicon nitride layer, a silicon oxy-nitride layer, or a dielectric layer formed by other suitable inorganic dielectric materials. The interconnect structure 220 may further include a post-passivation layer (not shown) formed over the passivation layer, wherein the post-passivation layer covers the passivation layer and the conductive pads 222, the post-passivation layer includes a plurality of contact openings, and the conductive pads 222 are partially revealed from the contact openings defined in the post passivation layer. The post-passivation layer may be a polyimide (PI) layer, a PBO layer, or a dielectric layer formed by other suitable organic dielectric materials. In some embodiments, the post-passivation layer is omitted.

Referring to FIG. 7 and FIG. 8, a thinning process of the semiconductor wafer W2 is performed such that the semiconductor substrate 210 of the semiconductor wafer W2 is thinned down. In some embodiments, the semiconductor wafer W2 is flipped upside down, and the semiconductor substrate 210 is thinned down from a back surface of the semiconductor wafer W2 through a thinning process. In some embodiments, the semiconductor substrate 210 is thinned down through a mechanical grinding process, a chemical mechanical polishing (CMP) process, an etching process, combinations thereof or other suitable removal processes. After performing the thinning process of the semiconductor wafer W2, the semiconductor substrate 210 is thinned down and portions of the through semiconductor vias 212 are revealed at the back surface of the semiconductor wafer W2. Furthermore, the through semiconductor vias 212 may slightly protrude from the back surface of the semiconductor wafer W2.

After performing the thinning process of the semiconductor wafer W2, a patterned dielectric layer 230 (e.g., silicon nitride layer) is formed to cover the back surface of the semiconductor wafer W2. The material of the patterned dielectric layer 230 is not limited to silicon nitride, other suitable dielectric materials may be utilized to form the patterned dielectric layer 230. In some embodiments, the patterned dielectric layer 230 may be formed by conformally depositing a dielectric material layer to cover the back surface of the semiconductor wafer W2 and the through semiconductor vias 212, and a grinding process is performed to remove portions of the conformally deposited dielectric material layer until the through semiconductor vias 212 are revealed. Then, a patterned bonding dielectric layer 240 is formed over the back surface of the semiconductor wafer W2 to cover the patterned dielectric layer 230. In some embodiments, thermal conductivity of the bonding dielectric layer 240 is greater than that of silicon dioxide. In some alternative embodiments, thermal conductivity of the bonding dielectric layer 240 is greater than that of the patterned dielectric layer 230. For example, the thermal conductivity of the bonding dielectric layer 240 is greater than about 1.4 W/mK. The bonding dielectric layer 240 may be a diamond like carbon (DLC) layer or other suitable dielectric layers having thermal conductivity greater than about 1.4 W/mK. For example, the thermal conductivity of the DLC layer 240 is greater than about 20 W/mK.

At least one photolithography process followed by at least one etching process may be performed to form the bonding dielectric layer 240 over the patterned dielectric layer 230 and the interconnect structure 220. The patterned bonding dielectric layer 240 may include openings 242 and trenches 244, wherein the through semiconductor vias 212 are partially revealed by the openings 242 defined in the patterned bonding dielectric layer 240. As illustrated in FIG. 8, the openings 242 may each include a via 242a and a trench 242b located above the via 242a, wherein the trenches 242b and the trenches 244 may be formed by a first photolithography process followed by a first etching process, while the vias 242a may be formed by a second photolithography process followed by a second etching process. The profile of the openings 242 and the trenches 244 defined in the patterned bonding dielectric layer 240 may be modified in accordance with design rule.

Figure 9:
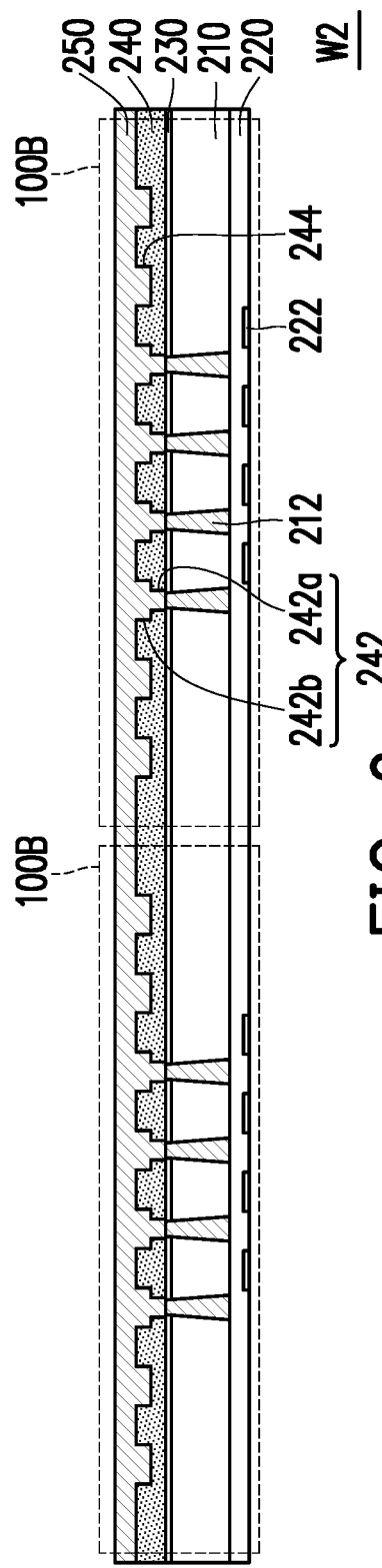

Referring to FIG. 8 and FIG. 9, a conductive material layer 250 is formed to cover the patterned bonding dielectric layer 240. For example, the material of the conductive material layer 250 includes copper or other suitable metallic materials. The conductive material layer 250 fills into the openings 242 and the trenches 244 defined in the patterned bonding dielectric layer 240 and covers a top surface of the patterned bonding dielectric layer 240. In some embodiments, a seed layer (e.g., sputtered Ti/Cu seed layer) is formed on the patterned bonding dielectric layer 240 and revealed portions of the through semiconductor vias 212 through a sputtering process, and at least one plating process is then performed such that the conductive material layer 250 is plated on the sputtered seed layer.

Figure 10:
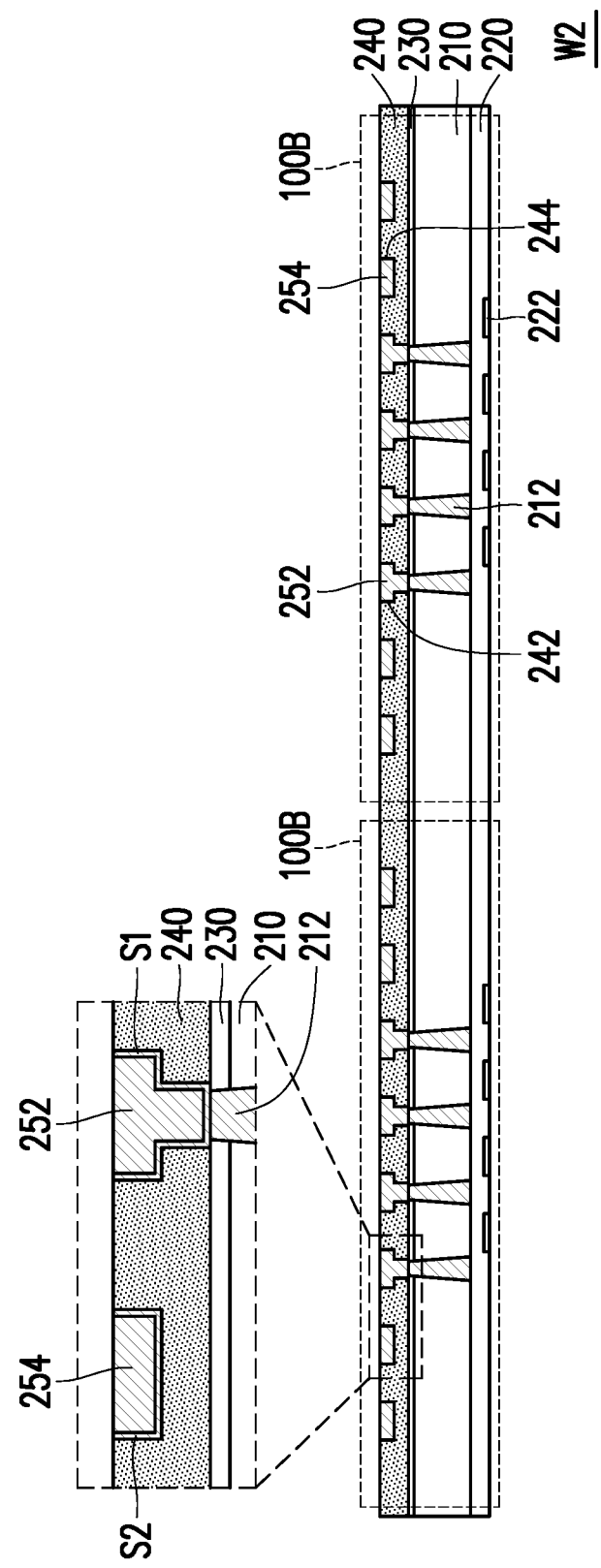

Referring to FIG. 9 and FIG. 10, a grinding process may be performed to remove a portion of the conductive material layer 250 until the top surface of the patterned bonding dielectric layer 240 is revealed. After performing the grinding process of the conductive material 250, bonding conductors 252 filled in the openings 242 and bonding conductors 254 filled in the trenches 244 are formed. The grinding process may be a chemical mechanical polish (CMP) process, a mechanical grinding process or combinations thereof. As illustrated in FIG. 10, top surfaces of the bonding conductors 252 and 254 may be substantially leveled with the top surface of the patterned bonding dielectric layer 240. In some other embodiments, the top surfaces of the bonding conductors 252 and 254 are slightly lower or slightly higher than the top surface of the patterned bonding dielectric layer 240 due to grinding selectivity.

In some embodiments where the conductive material layer 250 is formed on a sputtered seed layer (e.g., sputtered Ti/Cu seed layer) by a plating process, a portion of the conductive material layer 250 and portions of the sputtered seed layer formed on the top surface of the patterned bonding dielectric layer 240 are removed through the grinding process until the top surface of the patterned bonding dielectric layer 240 is revealed. After performing the grinding process, the bonding conductors 252 are spaced apart from the patterned bonding dielectric layer 240 by sputtered seed patterns S1, the bonding conductors 252 are spaced apart from the through semiconductor vias 212 by the sputtered seed patterns S1, and the bonding conductors 254 are spaced apart from the patterned bonding dielectric layer 240 by sputtered seed patterns S2.

In some embodiments, as illustrated in FIG. 8 through FIG. 10, a dual damascene process is performed to form the bonding conductors 252 and 254 embedded in the patterned bonding dielectric layer 240. In some alternative embodiments, a single damascene process is performed to form the bonding conductors embedded in the patterned bonding dielectric layer.

Figure 11:
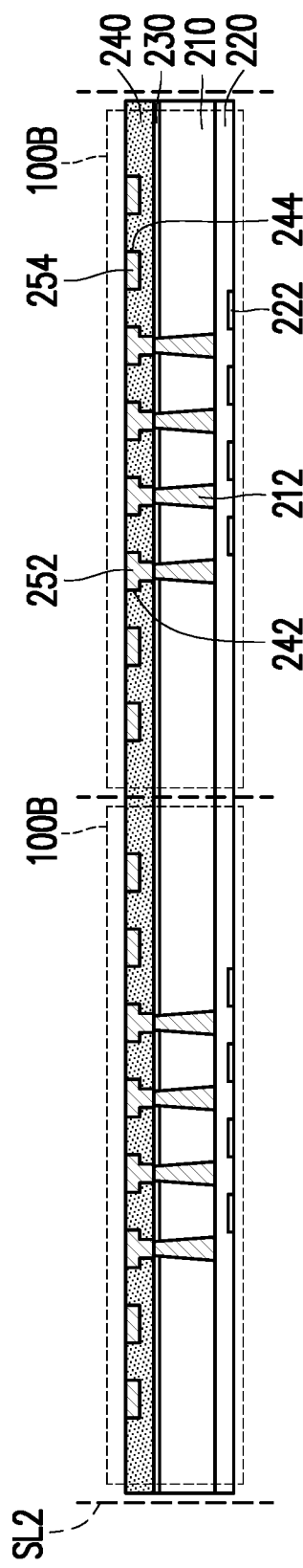
Figure 12:
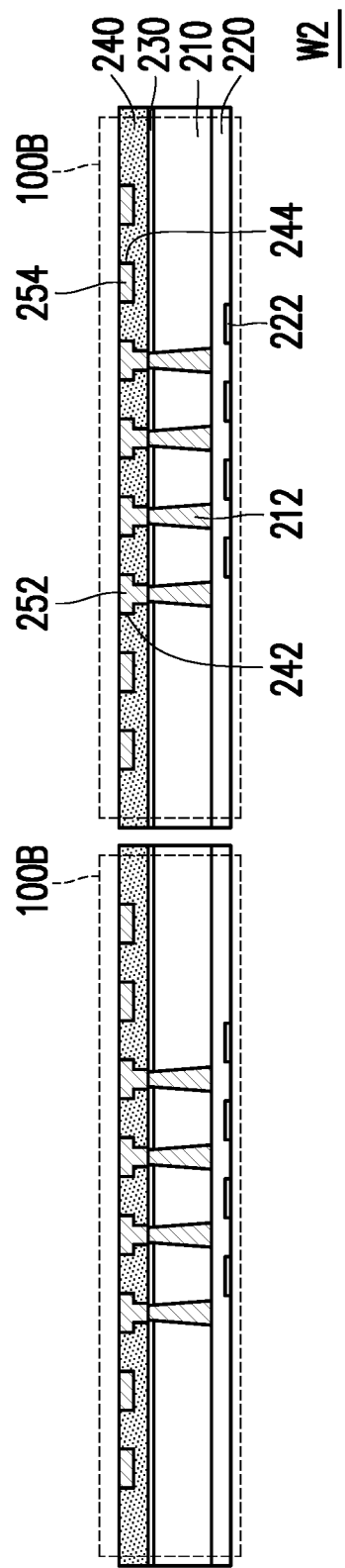

Referring to FIG. 11 and FIG. 12, a wafer sawing process is performed along the scribe lines SL2 of the semiconductor wafer W2 to singulate the semiconductor wafer W2 such that singulated semiconductor dies 100B are obtained. The semiconductor die 100B includes a semiconductor substrate 210, an interconnect structure 220 disposed on a first side of the semiconductor substrate 210, a patterned dielectric layer 230 disposed on a second side of the semiconductor substrate 210, and a bonding structure BS2 disposed on the patterned dielectric layer 230. The first side is opposite to the second side. In other words, interconnect structure 220 and the bonding structure BS2 are respectively disposed at opposite sides of the semiconductor substrate 210. The bonding structure BS2 may include a patterned bonding dielectric layer 240 and bonding conductors 252 and 254 embedded in the patterned bonding dielectric layer 240.

Since the bonding structure BS2 includes the patterned bonding dielectric layer 240 with high thermal conductivity (e.g., greater than about 1.4 W/mK), heat dissipation performance of the singulated semiconductor dies 100B is enhanced.

FIG. 13 through FIG. 18 are cross-sectional views schematically illustrating a process flow for fabricating a semiconductor die in accordance with still other embodiments of the present disclosure.

Figure 13:
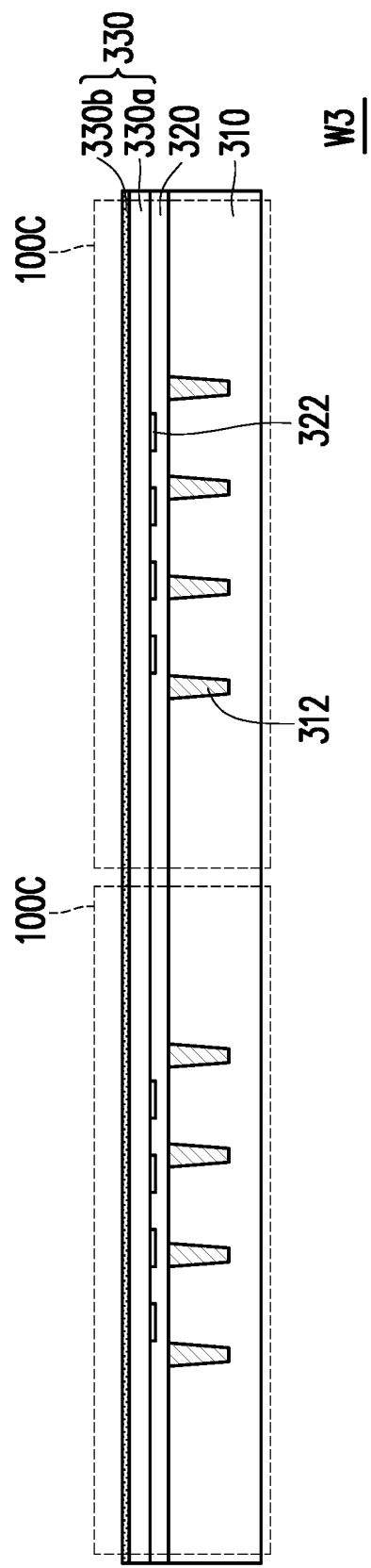
FIG. 13 through FIG. 18 are cross-sectional views schematically illustrating a process flow for fabricating a semiconductor die in accordance with still other embodiments of the present disclosure.

Referring to FIG. 13, a semiconductor wafer W3 including semiconductor dies 100C arranged in array is provided. The semiconductor wafer W1 may include a semiconductor substrate 310, an interconnect structure 320 disposed on the semiconductor substrate 310 and a bonding dielectric layer 330 covering the interconnect structure 320. The semiconductor substrate 310 may be a silicon substrate including active components (e.g., transistors or the like) and passive components (e.g., resistors, capacitors, inductors, or the like) formed therein. The active components and passive components are formed in the semiconductor substrate 310 through front end of line (FEOL) fabrication processes of the semiconductor wafer W3. The semiconductor substrate 310 may further include through semiconductor vias (TSVs) 312, wherein the through semiconductor vias 312 are electrically connected to the interconnect structure 320. The through semiconductor vias 312 may be embedded in the semiconductor substrate 310, and the height of the through semiconductor vias 312 is less than the thickness of the semiconductor substrate 310. The interconnect structure 320 may include interconnect wirings (e.g., copper interconnect wirings) and dielectric layer stacked alternately, wherein the interconnect wirings of the interconnect structure 320 are electrically connected to the active components and/or the passive components in the semiconductor substrate 310. The interconnect structure 320 is formed through back end of line (BEOL) fabrication processes of the semiconductor wafer W3. The topmost interconnect wirings may include conductive pads 322, and the conductive pads 322 may be aluminum pads, copper pads, or other suitable metallic pads. The interconnect structure 320 may further include a passivation layer (not shown), wherein the conductive pads 322 are partially covered by the passivation layer. In other words, the conductive pads 322 are partially revealed from the openings defined in the passivation layer. The passivation layer may be a silicon oxide layer, a silicon nitride layer, a silicon oxy-nitride layer, or a dielectric layer formed by other suitable inorganic dielectric materials. The interconnect structure 320 may further include a post-passivation layer (not shown) formed over the passivation layer, wherein the post-passivation layer covers the passivation layer and the conductive pads 322, the post-passivation layer includes a plurality of contact openings, and the conductive pads 322 are partially revealed from the contact openings defined in the post passivation layer. The post-passivation layer may be a polyimide (PI) layer, a PBO layer, or a dielectric layer formed by other suitable organic dielectric materials. In some embodiments, the post-passivation layer is omitted.

The bonding dielectric layer 330 may include a dielectric layer 330a and a dielectric layer 330b stacked over the dielectric layer 330a, wherein the dielectric layer 330b may be a silicon dioxide layer, silicon nitride, silicon oxynitride or other suitable dielectric layer, and the dielectric layer 330a may be a diamond like carbon (DLC) layer or other suitable dielectric layers having thermal conductivity greater than that of the dielectric layer 330b. For example, the thermal conductivity of the dielectric layer 330b is greater than about 1.2 W/mK and less than about 1.4 W/mK, and the thermal conductivity of the dielectric layer 330a is greater than about 1.4 W/mK. Furthermore, the thermal conductivity of the DLC layer 330a may be greater than about 20 W/mK.

In some alternative embodiments, the dielectric layer 330a may be a silicon dioxide layer, silicon nitride, silicon oxynitride or other suitable dielectric layer, and the dielectric layer 330b may be a diamond like carbon (DLC) layer or other suitable dielectric layers having thermal conductivity greater than that of the dielectric layer 330a.

Figure 14:
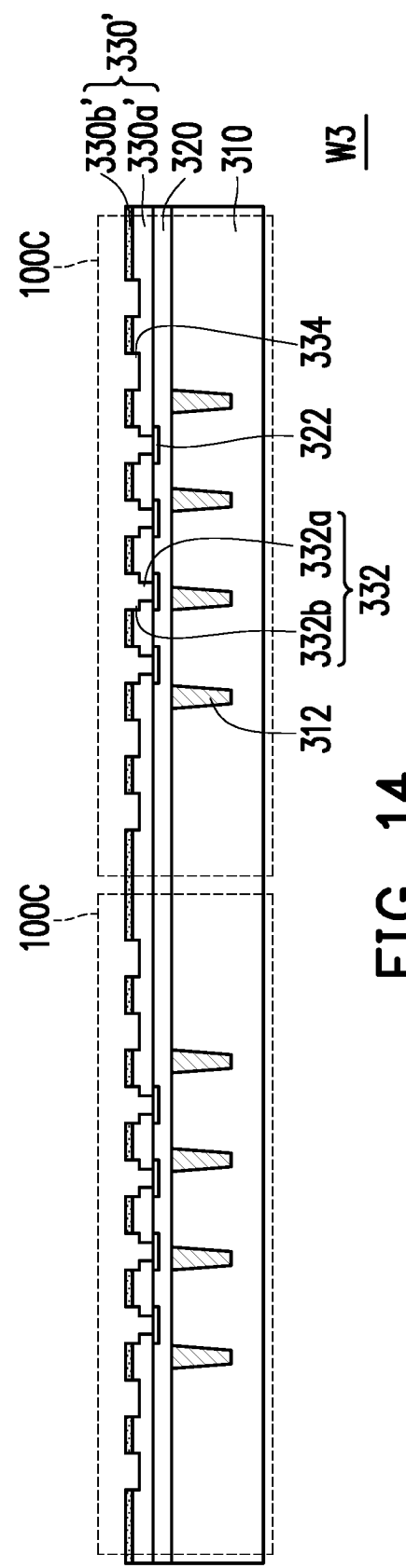

Referring to FIG. 13 and FIG. 14, a patterning process of the bonding dielectric layer 330 is performed. At least one photolithography process followed by at least one etching process may be performed to pattern the bonding dielectric layer 330 such that a patterned bonding dielectric layer 330' is formed over the interconnect structure 320. The patterned bonding dielectric layer 330' may include a patterned dielectric layer 330a' and a patterned dielectric layer 330b' stacked over the patterned dielectric layer 330a'. The patterned bonding dielectric layer 330' may include openings 332 and trenches 334, wherein the conductive pads 322 are partially revealed by the openings 332 defined in the patterned bonding dielectric layer 330a. As illustrated in FIG. 14, the openings 332 may each include a via 332a and a trench 332b located above the via 332a, wherein the trenches 332b and the trenches 334 may be formed by a first photolithography process followed by a first etching process, while the vias 332a may be formed by a second photolithography process followed by a second etching process. The via 332a may be defined and formed in the patterned dielectric layer 330a'. The profile of the openings 332 and the trenches 334 defined in the patterned bonding dielectric layer 330' may be modified in accordance with design rule.

Figure 15:
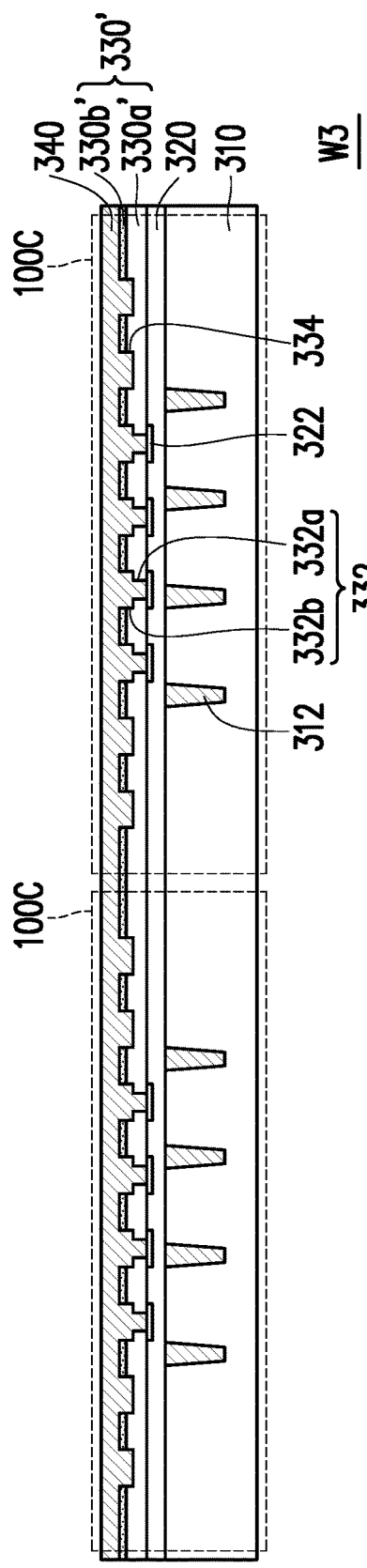

Referring to FIG. 14 and FIG. 15, a conductive material layer 340 is formed to cover the patterned bonding dielectric layer 330'. For example, the material of the conductive material layer 340 includes copper or other suitable metallic materials. The conductive material layer 340 fills into the openings 332 and the trenches 334 defined in the patterned bonding dielectric layer 330' and covers a top surface of the patterned bonding dielectric layer 330'. In some embodiments, a seed layer (e.g., sputtered Ti/Cu seed layer) is formed on the patterned bonding dielectric layer 330' and revealed portions of the conductive pads 322 through a sputtering process, and at least one plating process is then performed such that the conductive material layer 340 is plated on the sputtered seed layer.

Figure 16:
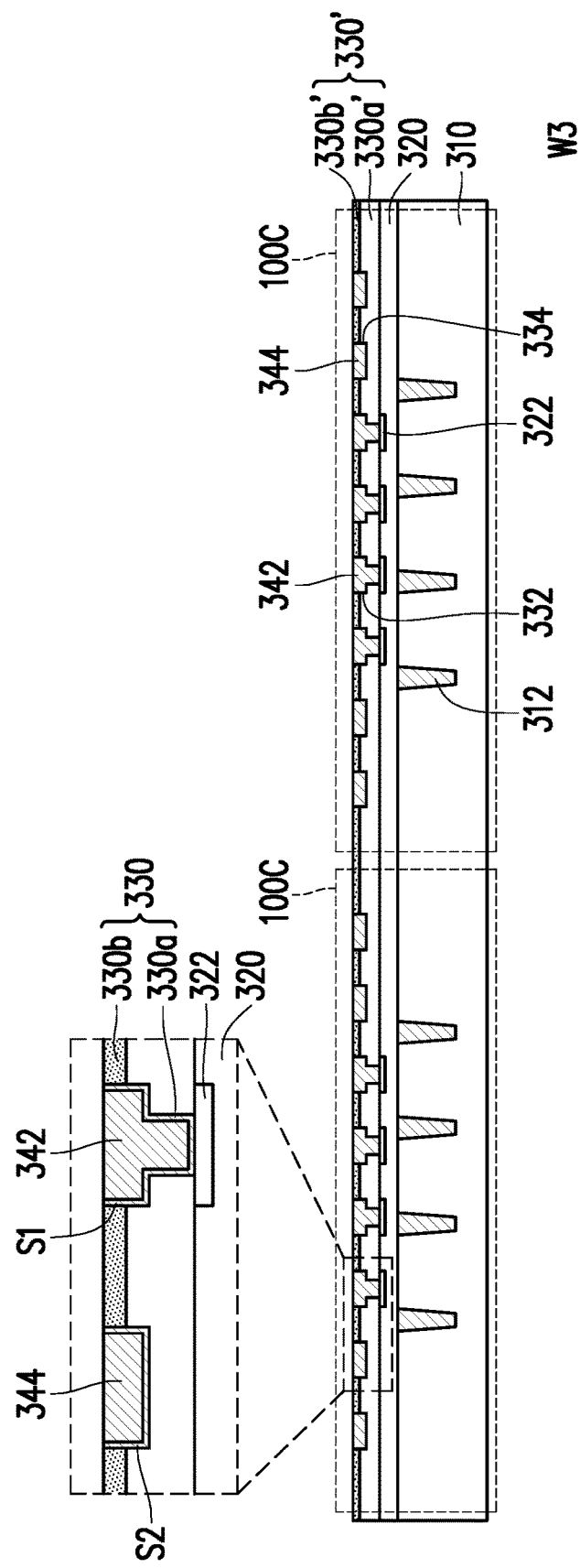

Referring to FIG. 15 and FIG. 16, a grinding process may be performed to remove a portion of the conductive material layer 340 until the top surface of the patterned bonding dielectric layer 330' (i.e. the patterned dielectric layer 330b') is revealed. After performing the grinding process of the conductive material 340, bonding conductors 342 filled in the openings 332 and bonding conductors 344 filled in the trenches 334 are formed. The grinding process may be a chemical mechanical polish (CMP) process, a mechanical grinding process or combinations thereof. As illustrated in FIG. 16, top surfaces of the bonding conductors 342 and 344 may be substantially leveled with the top surface of the patterned dielectric layer 330b'. In some other embodiments, the top surfaces of the bonding conductors 342 and 344 are slightly lower or slightly higher than the top surface of the patterned dielectric layer 330b' due to grinding selectivity.

In some embodiments where the conductive material layer 340 is formed on a sputtered seed layer (e.g., sputtered Ti/Cu seed layer) by a plating process, a portion of the conductive material layer 340 and portions of the sputtered seed layer formed on the top surface of the patterned bonding dielectric layer 330a are removed through the grinding process until the top surface of the patterned dielectric layer 330b' is revealed. After performing the grinding process, the bonding conductors 342 are spaced apart from the patterned bonding dielectric layer 330' by sputtered seed patterns S1, the bonding conductors 342 are spaced apart from the conductive pads 322 by the sputtered seed patterns S1, and the bonding conductors 344 are spaced apart from the patterned bonding dielectric layer 330' by sputtered seed patterns S2.

In some embodiments, as illustrated in FIG. 14 through FIG. 16, a dual damascene process is performed to form the bonding conductors 342 and 344 embedded in the patterned bonding dielectric layer 330'. In some alternative embodiments, a single damascene process is performed to form the bonding conductors embedded in the patterned bonding dielectric layer 330'.

Figure 17:
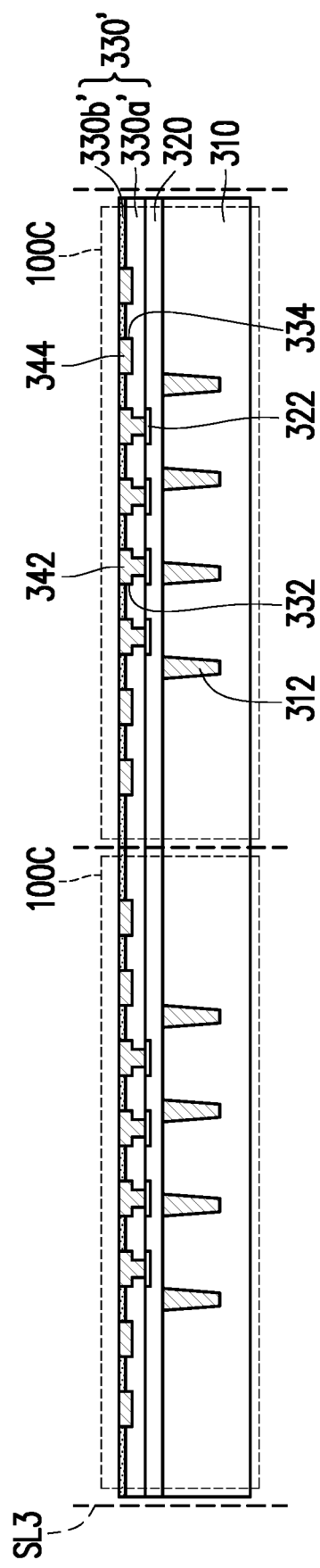
Figure 18:
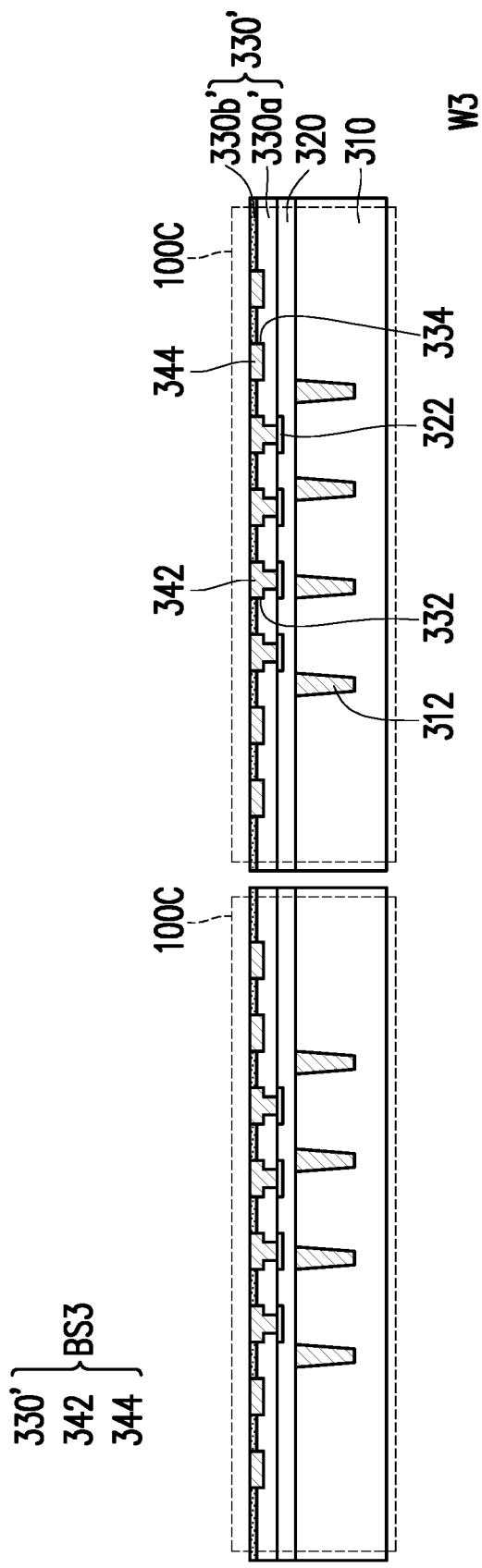

Referring to FIG. 17 and FIG. 18, a wafer sawing process is performed along the scribe lines SL3 of the semiconductor wafer W3 to singulate the semiconductor wafer W3 such that singulated semiconductor dies 100C are obtained. The semiconductor die 100C includes a semiconductor substrate 310, an interconnect structure 320 disposed on the semiconductor substrate 310, and a bonding structure BS3 disposed on the interconnect structure 320. The bonding structure BS3 may include a patterned bonding dielectric layer 330', bonding conductors 342 and bonding conductors 344, wherein the patterned bonding dielectric layer 330' includes a patterned dielectric layer 330a' and a patterned dielectric layer 330b', the bonding conductors 342 and 344 are embedded in the patterned dielectric layer 330a' and the patterned dielectric layer 330b'.

Since the bonding structure BS3 includes the patterned dielectric layer 330a' or 330b' with high thermal conductivity (e.g., greater than about 1.4 W/mK), heat dissipation performance of the singulated semiconductor dies 100C is enhanced.

FIG. 19 through FIG. 24 are cross-sectional views schematically illustrating a process flow for fabricating a semiconductor die in accordance with some alternative embodiments of the present disclosure.

Figure 19:
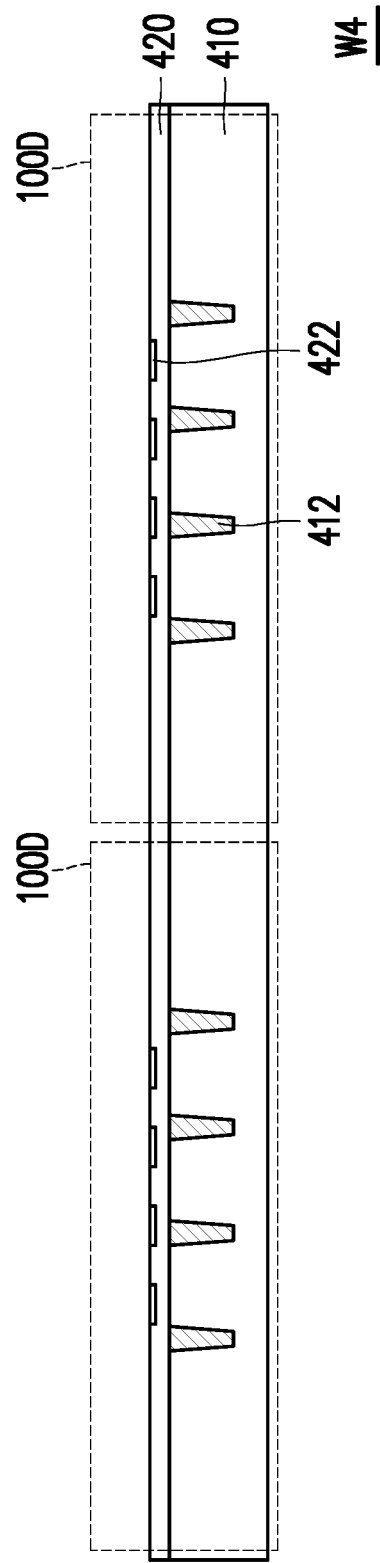

Referring to FIG. 19, a semiconductor wafer W4 including semiconductor dies 100D arranged in array is provided. The semiconductor wafer W4 may include a semiconductor substrate 410 and an interconnect structure 420 disposed on the semiconductor substrate 410. The semiconductor substrate 410 may be a silicon substrate including active components (e.g., transistors or the like) and passive components (e.g., resistors, capacitors, inductors, or the like) formed therein. The active components and passive components are formed in the semiconductor substrate 410 through front end of line (FEOL) fabrication processes of the semiconductor wafer W4. The semiconductor substrate 410 may further include through semiconductor vias (TSVs) 412, wherein the through semiconductor vias 412 are electrically connected to the interconnect structure 420. The through semiconductor vias 412 may be embedded in the semiconductor substrate 410, and the height of the through semiconductor vias 412 is less than the thickness of the semiconductor substrate 410. The interconnect structure 420 may include interconnect wirings (e.g., copper interconnect wirings) and dielectric layer stacked alternately, wherein the interconnect wirings of the interconnect structure 420 are electrically connected to the active components and/or the passive components in the semiconductor substrate 410. The interconnect structure 420 is formed through back end of line (BEOL) fabrication processes of the semiconductor wafer W4. The topmost interconnect wirings may include conductive pads 422, and the conductive pads 422 may be aluminum pads, copper pads, or other suitable metallic pads. The interconnect structure 420 may further include a passivation layer (not shown), wherein the conductive pads 422 are partially covered by the passivation layer. In other words, the conductive pads 422 are partially revealed from the openings defined in the passivation layer. The passivation layer may be a silicon oxide layer, a silicon nitride layer, a silicon oxy-nitride layer, or a dielectric layer formed by other suitable inorganic dielectric materials. The interconnect structure 420 may further include a post-passivation layer (not shown) formed over the passivation layer, wherein the post-passivation layer covers the passivation layer and the conductive pads 422, the post-passivation layer includes a plurality of contact openings, and the conductive pads 422 are partially revealed from the contact openings defined in the post passivation layer. The post-passivation layer may be a polyimide (PI) layer, a PBO layer, or a dielectric layer formed by other suitable organic dielectric materials. In some embodiments, the post-passivation layer is omitted.

Figure 20:
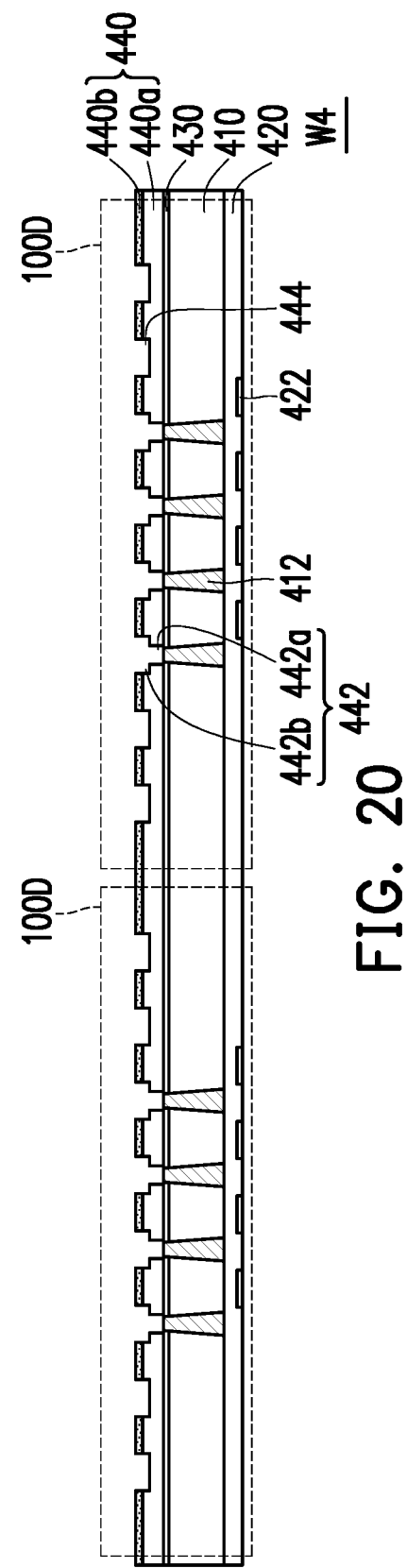

Referring to FIG. 19 and FIG. 20, a thinning process of the semiconductor wafer W4 is performed such that the semiconductor substrate 410 of the semiconductor wafer W4 is thinned down. In some embodiments, the semiconductor wafer W4 is flipped upside down, and the semiconductor substrate 410 is thinned down from a back surface of the semiconductor wafer W4 through a thinning process. In some embodiments, the semiconductor substrate 410 is thinned down through a mechanical grinding process, a chemical mechanical polishing (CMP) process, an etching process, combinations thereof or other suitable removal processes. After performing the thinning process of the semiconductor wafer W4, the semiconductor substrate 410 is thinned down and portions of the through semiconductor vias 412 are revealed at the back surface of the semiconductor wafer W4. Furthermore, the through semiconductor vias 412 may slightly protrude from the back surface of the semiconductor wafer W4.

After performing the thinning process of the semiconductor wafer W4, a patterned dielectric layer 430 (e.g., silicon nitride layer) is formed to cover the back surface of the semiconductor wafer W4. In some embodiments, the patterned dielectric layer 430 may be formed by conformally depositing a dielectric material layer to cover the back surface of the semiconductor wafer W4 and the through semiconductor vias 412, and a grinding process is performed to remove portions of the conformally deposited dielectric material layer until the through semiconductor vias 412 are revealed. Then, a patterned bonding dielectric layer 440 is formed over the back surface of the semiconductor wafer W4 to cover the patterned dielectric layer 430. The patterned bonding dielectric layer 440 may include a patterned dielectric layer 440a and a patterned dielectric layer 440b stacked over the patterned dielectric layer 440a, wherein the patterned dielectric layer 440a may be a silicon dioxide layer, and the patterned dielectric layer 440b may be a diamond like carbon (DLC) layer or other suitable dielectric layers having thermal conductivity greater than that of the patterned dielectric layer 440a. For example, the thermal conductivity of the patterned dielectric layer 440a is greater than about 1.2 W/mK and less than about 1.4 W/mK, and the thermal conductivity of the patterned dielectric layer 440b is greater than about 1.4 W/mK. Furthermore, the thermal conductivity of the DLC layer 440b may be greater than about 1.4 W/mK and less than about 3.5 W/mK.

In some alternative embodiments, the dielectric layer 440b may be a silicon dioxide layer, and the dielectric layer 440a may be a diamond like carbon (DLC) layer or other suitable dielectric layers having thermal conductivity greater than that of the dielectric layer 440b.

At least one photolithography process followed by at least one etching process may be performed to form the bonding dielectric layer 440 over the patterned dielectric layer 430 and the interconnect structure 420. The patterned bonding dielectric layer 440 may include openings 442 and trenches 444, wherein the through semiconductor vias 412 are partially revealed by the openings 442 defined in the patterned bonding dielectric layer 440. As illustrated in FIG. 20, the openings 442 may each include a via 442a and a trench 442b located above the via 442a, wherein the trenches 442b and the trenches 444 may be formed by a first photolithography process followed by a first etching process, while the vias 442a may be formed by a second photolithography process followed by a second etching process. The via 442a may be defined and formed in the patterned dielectric layer 440a. The profile of the openings 442 and the trenches 44 defined in the patterned bonding dielectric layer 440 may be modified in accordance with design rule.

Referring to FIG. 20 and FIG. 21, a conductive material layer 450 is formed to cover the patterned bonding dielectric layer 440. For example, the material of the conductive material layer 450 includes copper or other suitable metallic materials. The conductive material layer 450 fills into the openings 442 and the trenches 444 defined in the patterned bonding dielectric layer 440 and covers a top surface of the patterned bonding dielectric layer 440 (i.e. the patterned dielectric layer 440b). In some embodiments, a seed layer (e.g., sputtered Ti/Cu seed layer) is formed on the patterned bonding dielectric layer 440 and revealed portions of the through semiconductor vias 412 through a sputtering process, and at least one plating process is then performed such that the conductive material layer 450 is plated on the sputtered seed layer.

Referring to FIG. 21 and FIG. 22, a grinding process may be performed to remove a portion of the conductive material layer 450 until the top surface of the patterned dielectric layer 440b is revealed. After performing the grinding process of the conductive material 450, bonding conductors 452 filled in the openings 442 and bonding conductors 454 filled in the trenches 444 are formed. The grinding process may be a chemical mechanical polish (CMP) process, a mechanical grinding process or combinations thereof. As illustrated in FIG. 22, top surfaces of the bonding conductors 452 and 454 may be substantially leveled with the top surface of the patterned dielectric layer 440b. In some other embodiments, the top surfaces of the bonding conductors 452 and 454 are slightly lower or slightly higher than the top surface of the patterned dielectric layer 440b due to grinding selectivity.

In some embodiments where the conductive material layer 450 is formed on a sputtered seed layer (e.g., sputtered Ti/Cu seed layer) by a plating process, a portion of the conductive material layer 450 and portions of the sputtered seed layer formed on the top surface of the patterned dielectric layer 440b are removed through the grinding process until the top surface of the patterned dielectric layer 440b is revealed. After performing the grinding process, the bonding conductors 452 are spaced apart from the patterned bonding dielectric layer 440 by sputtered seed patterns S1, the bonding conductors 452 are spaced apart from the through semiconductor vias 412 by the sputtered seed patterns S1, and the bonding conductors 454 are spaced apart from the patterned bonding dielectric layer 440 by sputtered seed patterns S2.

In some embodiments, as illustrated in FIG. 20 through FIG. 22, a dual damascene process is performed to form the bonding conductors 452 and 454 embedded in the patterned bonding dielectric layer 440. In some alternative embodiments, a single damascene process is performed to form the bonding conductors embedded in the patterned bonding dielectric layer 440.

Figure 23:
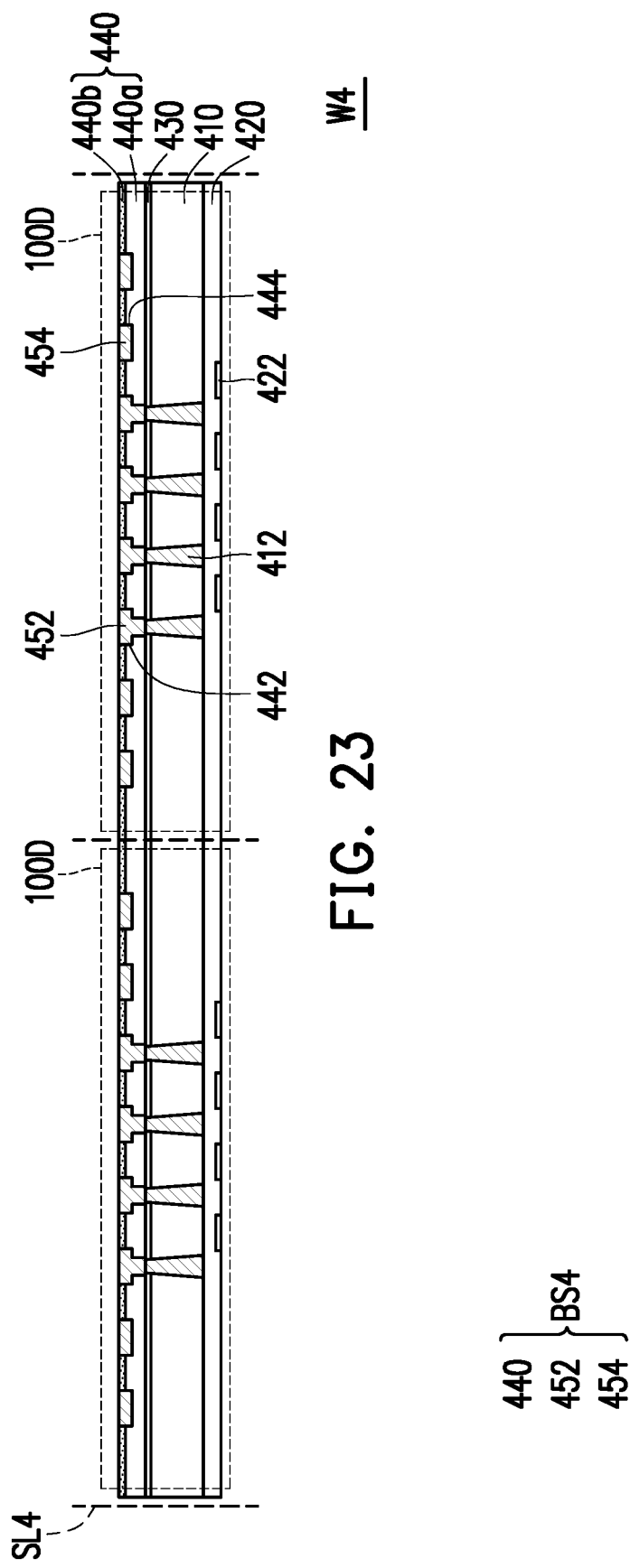
Figure 24:
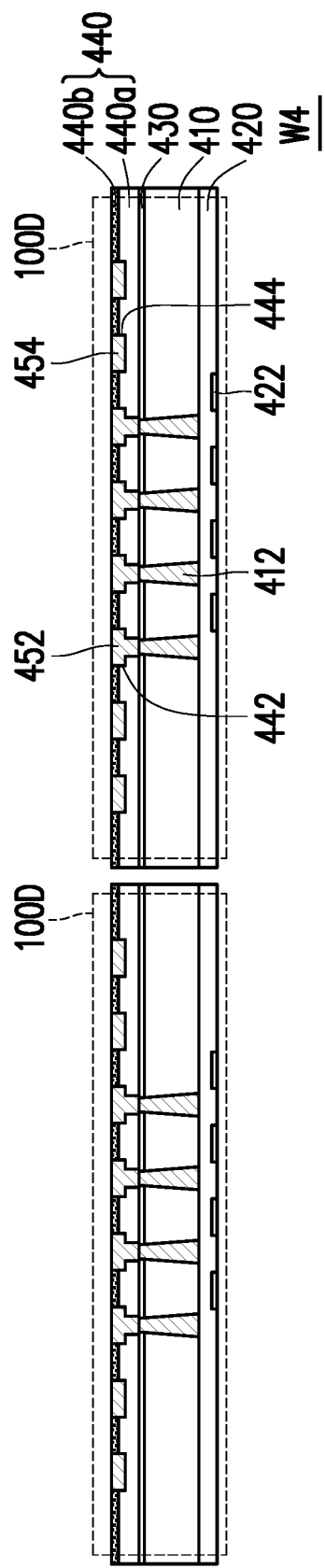

Referring to FIG. 23 and FIG. 24, a wafer sawing process is performed along the scribe lines SL4 of the semiconductor wafer W4 to singulate the semiconductor wafer W4 such that singulated semiconductor dies 100D are obtained. The semiconductor die 100D includes a semiconductor substrate 410, an interconnect structure 420 disposed on a first side of the semiconductor substrate 410, a patterned dielectric layer 430 disposed on a second side of the semiconductor substrate 410, and a bonding structure BS4 disposed on the patterned dielectric layer 430. The first side is opposite to the second side. In other words, interconnect structure 420 and the bonding structure BS4 are respectively disposed at opposite sides of the semiconductor substrate 410. The bonding structure BS4 may include a patterned bonding dielectric layer 440 and bonding conductors 452 and 454 embedded in the patterned bonding dielectric layer 440.

Since the bonding structure BS4 includes the patterned dielectric layer 440a or 440b with high thermal conductivity (e.g., greater than about 1.4 W/mK), heat dissipation performance of the singulated semiconductor dies 100D is enhanced.

Each of the above-mentioned semiconductor dies 100A, 100B, 100C and 100D may be a part of an SoIC component. At least two semiconductor dies among the semiconductor dies 100A, 100B, 100C and 100D may be bonded with each other to constitute an SoIC component. Various types of SoIC components are illustrated and described in accompany with FIG. 25A through FIG. 25J. In the following description, the structure of the semiconductor dies 100A1, 100A2 and 100A3 is substantially identical with that of the semiconductor die 100A illustrated in FIG. 6; the structure of the semiconductor dies 100B1 and 100B2 is substantially identical with that of the semiconductor die 100B illustrated in FIG. 12; the structure of the semiconductor dies 100C1 and 100C2 is substantially identical with that of the semiconductor die 100C illustrated in FIG. 18; and the structure of the semiconductor dies 100D1 and 100D2 is substantially identical with that of the semiconductor die 100D illustrated in FIG. 24.

FIG. 25A through FIG. 25J are cross-sectional views schematically illustrating various SoIC components in accordance with some embodiments of the present disclosure.

Figure 25A:
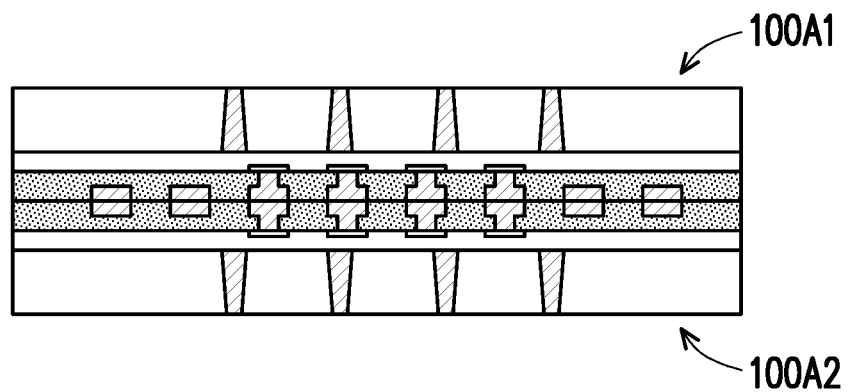
FIG. 25A through FIG. 25J are cross-sectional views schematically illustrating various SoIC components in accordance with some embodiments of the present disclosure.

Referring to FIG. 25A, an SoIC component including a top tier semiconductor die 100A1 and a bottom tier semiconductor die 100A2 is provided. The top tier semiconductor die 100A1 and the bottom tier semiconductor die 100A2 are both fabricated by the processes illustrated in FIG. 1 through FIG. 5. In some embodiments, a face-to-face bonding process is performed to bond the top tier semiconductor die 100A1 with the bottom tier semiconductor die 100A2. A bonding interface between the top tier semiconductor die 100A1 and the bottom tier semiconductor die 100A2 may include dielectric-to-dielectric bonding interfaces and metal-to-metal bonding interfaces. In some embodiments, a chip-to-wafer bonding process is performed to bond the singulated top tier semiconductor die 100A1 with the bottom tier semiconductor die 100A2 in the semiconductor wafer W1, wherein the singulated top tier semiconductor die 100A1 is fabricated by the processes illustrated in FIG. 1 through FIG. 6, and the bottom tier semiconductor dies 100A2 in the semiconductor wafer W1 are fabricated by the processes illustrated in FIG. 1 through FIG. 5. In some other embodiments, a wafer-to-wafer bonding process is performed to bond the top tier semiconductor die 100A1 in the semiconductor wafer W1 with the bottom tier semiconductor die 100A2 in the semiconductor wafer W1, wherein both the top tier semiconductor die 100A1 and the bottom tier semiconductor dies 100A2 in the semiconductor wafer W1 are fabricated by the processes illustrated in FIG. 1 through FIG. 5. In FIG. 25A, the patterned bonding dielectric layers of the top tier semiconductor die 100A1 and the bottom tier semiconductor dies 100A2 provide a bonding interface with good thermal conductivity to dissipate heat effectively. Accordingly, hot spot issue occurred in the SoIC component illustrated in FIG. 25A may be solved.

Figure 25B:
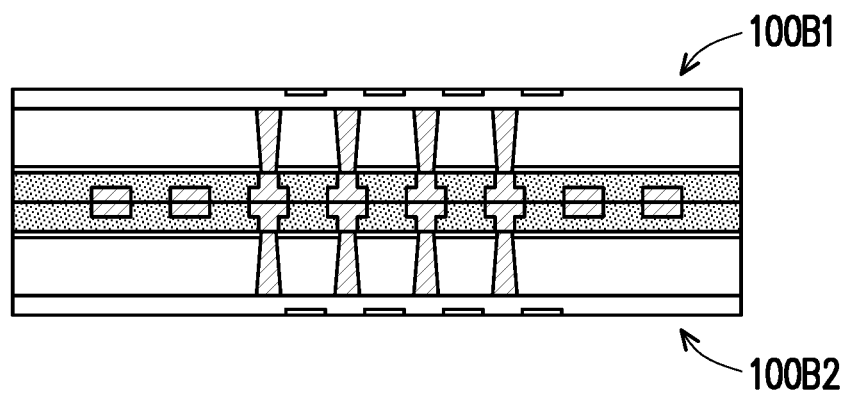

Referring to FIG. 25B, an SoIC component including a top tier semiconductor die 100B1 and a bottom tier semiconductor die 100B2 is provided. The top tier semiconductor die 100B1 and the bottom tier semiconductor die 100B2 are both fabricated by the processes illustrated in FIG. 7 through FIG. 11. In some embodiments, a back-to-back bonding process is performed to bond the top tier semiconductor die 100B1 with the bottom tier semiconductor die 100B2. A bonding interface between the top tier semiconductor die 100B1 and the bottom tier semiconductor die 100B2 may include dielectric-to-dielectric bonding interfaces and metal-to-metal bonding interfaces. In some embodiments, a chip-to-wafer bonding process is performed to bond the singulated top tier semiconductor die 100B1 with the bottom tier semiconductor die 100B2 in the semiconductor wafer W2, wherein the singulated top tier semiconductor die 100B1 is fabricated by the processes illustrated in FIG. 7 through FIG. 12, and the bottom tier semiconductor dies 100B2 in the semiconductor wafer W1 are fabricated by the processes illustrated in FIG. 7 through FIG. 11. In some other embodiments, a wafer-to-wafer bonding process is performed to bond the top tier semiconductor die 100B1 in the semiconductor wafer W2 with the bottom tier semiconductor die 100B2 in the semiconductor wafer W2, wherein both the top tier semiconductor die 100B1 and the bottom tier semiconductor dies 100B2 in the semiconductor wafer W2 are fabricated by the processes illustrated in FIG. 7 through FIG. 11. In FIG. 25B, the patterned bonding dielectric layers of the top tier semiconductor die 100B1 and the bottom tier semiconductor dies 100B2 provide a bonding interface with good thermal conductivity to dissipate heat effectively. Accordingly, hot spot issue occurred in the SoIC component illustrated in FIG. 25B may be solved.

Figure 25C:
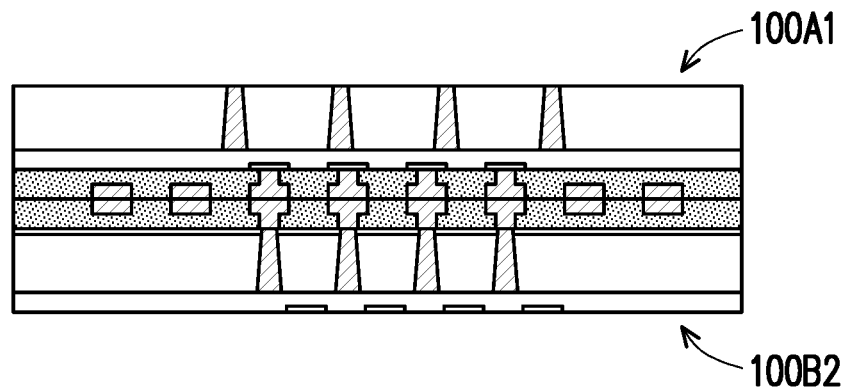

Referring to FIG. 25C, an SoIC component including a top tier semiconductor die 100A1 and a bottom tier semiconductor die 100B2 is provided. The top tier semiconductor die 100A1 are fabricated by the processes illustrated in FIG. 1 through FIG. 5, and the bottom tier semiconductor die 100B2 are fabricated by the processes illustrated in FIG. 7 through FIG. 11. In some embodiments, a face-to-back bonding process is performed to bond the top tier semiconductor die 100A1 with the bottom tier semiconductor die 100B2. A bonding interface between the top tier semiconductor die 100A1 and the bottom tier semiconductor die 100B2 may include dielectric-to-dielectric bonding interfaces and metal-to-metal bonding interfaces. In some embodiments, a chip-to-wafer bonding process is performed to bond the singulated top tier semiconductor die 100A1 with the bottom tier semiconductor die 100B2 in the semiconductor wafer W2, wherein the singulated top tier semiconductor die 100A1 is fabricated by the processes illustrated in FIG. 1 through FIG. 6, and the bottom tier semiconductor dies 100B2 in the semiconductor wafer W2 are fabricated by the processes illustrated in FIG. 7 through FIG. 11. In some other embodiments, a wafer-to-wafer bonding process is performed to bond the top tier semiconductor die 100A1 in the semiconductor wafer W1 with the bottom tier semiconductor die 100B2 in the semiconductor wafer W2, wherein the top tier semiconductor die 100A1 in the semiconductor wafer W1 are fabricated by the processes illustrated in FIG. 1 through FIG. 5, and the bottom tier semiconductor dies 100B2 in the semiconductor wafer W2 are fabricated by the processes illustrated in FIG. 7 through FIG. 11. In FIG. 25C, the patterned bonding dielectric layers of the top tier semiconductor die 100A1 and the bottom tier semiconductor dies 100B2 provide a bonding interface with good thermal conductivity to dissipate heat effectively. Accordingly, hot spot issue occurred in the SoIC component illustrated in FIG. 25C may be solved.

Figure 25D:
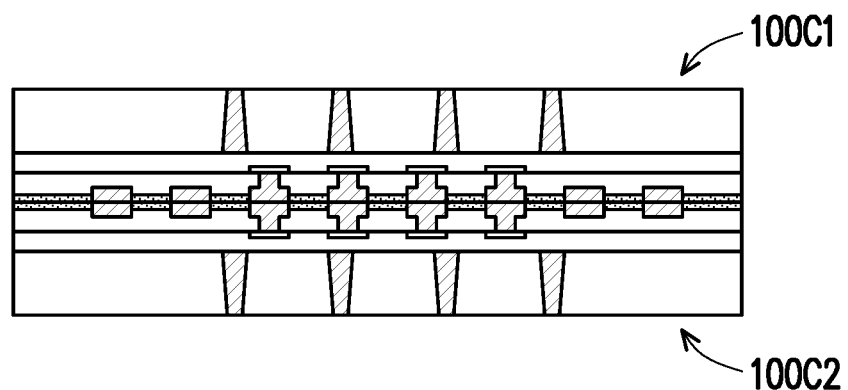

Referring to FIG. 25D, an SoIC component including a top tier semiconductor die 100C1 and a bottom tier semiconductor die 100C2 is provided. The top tier semiconductor die 100C1 and the bottom tier semiconductor die 100C2 are both fabricated by the processes illustrated in FIG. 13 through FIG. 18. In some embodiments, a face-to-face bonding process is performed to bond the top tier semiconductor die 100C1 with the bottom tier semiconductor die 100C2. A bonding interface between the top tier semiconductor die 100C1 and the bottom tier semiconductor die 100C2 may include dielectric-to-dielectric bonding interfaces and metal-to-metal bonding interfaces. In some embodiments, a chip-to-wafer bonding process is performed to bond the singulated top tier semiconductor die 100C1 with the bottom tier semiconductor die 100C2 in the semiconductor wafer W3, wherein the singulated top tier semiconductor die 100C1 is fabricated by the processes illustrated in FIG. 13 through FIG. 17, and the bottom tier semiconductor dies 100C2 in the semiconductor wafer W3 are fabricated by the processes illustrated in FIG. 13 through FIG. 17. In some other embodiments, a wafer-to-wafer bonding process is performed to bond the top tier semiconductor die 100C1 in the semiconductor wafer W3 with the bottom tier semiconductor die 100C2 in the semiconductor wafer W3, wherein both the top tier semiconductor die 100C1 and the bottom tier semiconductor dies 100C2 in the semiconductor wafer W3 are fabricated by the processes illustrated in FIG. 13 through FIG. 17. In FIG. 25D, the patterned bonding dielectric layers of the top tier semiconductor die 100C1 and the bottom tier semiconductor dies 100C2 provide a bonding interface with good thermal conductivity to dissipate heat effectively. Accordingly, hot spot issue occurred in the SoIC component illustrated in FIG. 25D may be solved.

Figure 25E:
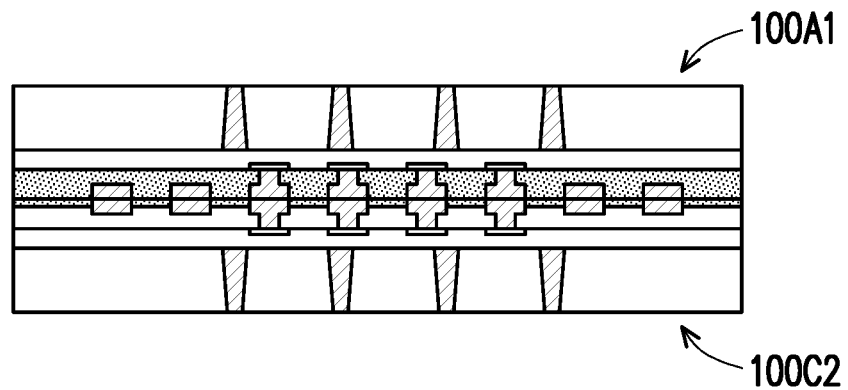

Referring to FIG. 25E, an SoIC component including a top tier semiconductor die 100A1 and a bottom tier semiconductor die 100C2 is provided. The top tier semiconductor die 100A1 are fabricated by the processes illustrated in FIG. 1 through FIG. 5, and the bottom tier semiconductor die 100C2 are fabricated by the processes illustrated in FIG. 13 through FIG. 17. In some embodiments, a face-to-face bonding process is performed to bond the top tier semiconductor die 100A1 with the bottom tier semiconductor die 100C2. A bonding interface between the top tier semiconductor die 100A1 and the bottom tier semiconductor die 100C2 may include dielectric-to-dielectric bonding interfaces and metal-to-metal bonding interfaces. In some embodiments, a chip-to-wafer bonding process is performed to bond the singulated top tier semiconductor die 100A1 with the bottom tier semiconductor die 100C2 in the semiconductor wafer W3, wherein the singulated top tier semiconductor die 100A1 is fabricated by the processes illustrated in FIG. 1 through FIG. 6, and the bottom tier semiconductor dies 100C2 in the semiconductor wafer W3 are fabricated by the processes illustrated in FIG. 13 through FIG. 17. In some other embodiments, a wafer-to-wafer bonding process is performed to bond the top tier semiconductor die 100A1 in the semiconductor wafer W1 with the bottom tier semiconductor die 100C2 in the semiconductor wafer W3, wherein the top tier semiconductor die 100A1 in the semiconductor wafer W1 are fabricated by the processes illustrated in FIG. 1 through FIG. 5, and the bottom tier semiconductor dies 100C2 in the semiconductor wafer W3 are fabricated by the processes illustrated in FIG. 13 through FIG. 17. In FIG. 25E, the patterned bonding dielectric layers of the top tier semiconductor die 100A1 and the bottom tier semiconductor dies 100C2 provide a bonding interface with good thermal conductivity to dissipate heat effectively. Accordingly, hot spot issue occurred in the SoIC component illustrated in FIG. 25E may be solved.

Figure 25F:
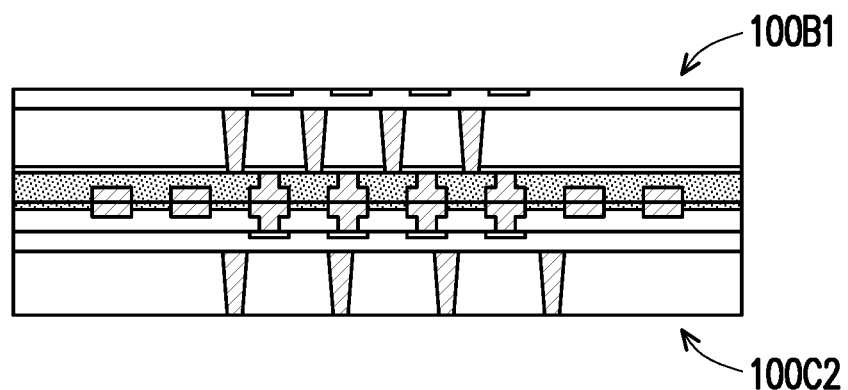

Referring to FIG. 25F, an SoIC component including a top tier semiconductor die 100B1 and a bottom tier semiconductor die 100C2 is provided. The top tier semiconductor die 100B1 are fabricated by the processes illustrated in FIG. 7 through FIG. 11, and the bottom tier semiconductor die 100C2 are fabricated by the processes illustrated in FIG. 13 through FIG. 17. In some embodiments, a face-to-back bonding process is performed to bond the top tier semiconductor die 100B1 with the bottom tier semiconductor die 100C2. A bonding interface between the top tier semiconductor die 100B1 and the bottom tier semiconductor die 100C2 may include dielectric-to-dielectric bonding interfaces and metal-to-metal bonding interfaces. In some embodiments, a chip-to-wafer bonding process is performed to bond the singulated top tier semiconductor die 100B1 with the bottom tier semiconductor die 100C2 in the semiconductor wafer W3, wherein the singulated top tier semiconductor die 100B1 is fabricated by the processes illustrated in FIG. 7 through FIG. 12, and the bottom tier semiconductor dies 100C2 in the semiconductor wafer W3 are fabricated by the processes illustrated in FIG. 13 through FIG. 17. In some other embodiments, a wafer-to-wafer bonding process is performed to bond the top tier semiconductor die 100B1 in the semiconductor wafer W2 with the bottom tier semiconductor die 100C2 in the semiconductor wafer W3, wherein the top tier semiconductor die 100B1 in the semiconductor wafer W2 are fabricated by the processes illustrated in FIG. 7 through FIG. 11, and the bottom tier semiconductor dies 100C2 in the semiconductor wafer W3 are fabricated by the processes illustrated in FIG. 13 through FIG. 17. In FIG. 25F, the patterned bonding dielectric layers of the top tier semiconductor die 100B1 and the bottom tier semiconductor dies 100C2 provide a bonding interface with good thermal conductivity to dissipate heat effectively. Accordingly, hot spot issue occurred in the SoIC component illustrated in FIG. 25F may be solved.

Figure 25G:
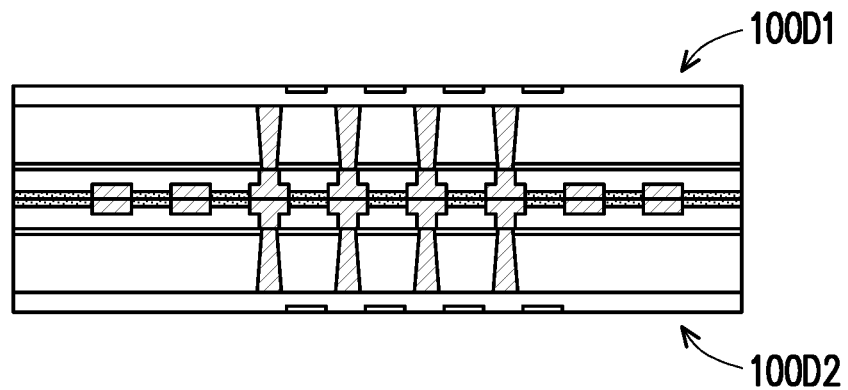

Referring to FIG. 25G, an SoIC component including a top tier semiconductor die 100D1 and a bottom tier semiconductor die 100D2 is provided. The top tier semiconductor die 100D1 and the bottom tier semiconductor die 100D2 are both fabricated by the processes illustrated in FIG. 19 through FIG. 23. In some embodiments, a back-to-back bonding process is performed to bond the top tier semiconductor die 100D1 with the bottom tier semiconductor die 100D2. A bonding interface between the top tier semiconductor die 100D1 and the bottom tier semiconductor die 100D2 may include dielectric-to-dielectric bonding interfaces and metal-to-metal bonding interfaces. In some embodiments, a chip-to-wafer bonding process is performed to bond the singulated top tier semiconductor die 100D1 with the bottom tier semiconductor die 100D2 in the semiconductor wafer W4, wherein the singulated top tier semiconductor die 100D1 is fabricated by the processes illustrated in FIG. 19 through FIG. 24, and the bottom tier semiconductor dies 100D2 in the semiconductor wafer W4 are fabricated by the processes illustrated in FIG. 19 through FIG. 23. In some other embodiments, a wafer-to-wafer bonding process is performed to bond the top tier semiconductor die 100D1 in the semiconductor wafer W4 with the bottom tier semiconductor die 100D2 in the semiconductor wafer W4, wherein both the top tier semiconductor die 100D1 and the bottom tier semiconductor dies 100D2 in the semiconductor wafer W4 are fabricated by the processes illustrated in FIG. 19 through FIG. 23. In FIG. 25G, the patterned bonding dielectric layers of the top tier semiconductor die 100D1 and the bottom tier semiconductor dies 100D2 provide a bonding interface with good thermal conductivity to dissipate heat effectively. Accordingly, hot spot issue occurred in the SoIC component illustrated in FIG. 25G may be solved.

Figure 25H:
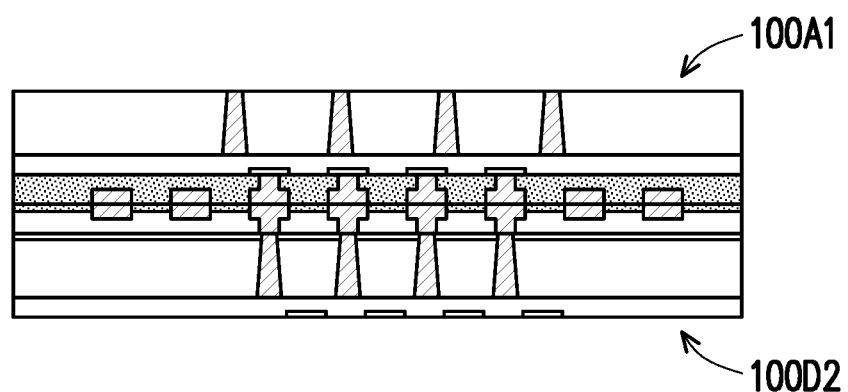

Referring to FIG. 25H, an SoIC component including a top tier semiconductor die 100A1 and a bottom tier semiconductor die 100D2 is provided. The top tier semiconductor die 100A1 are fabricated by the processes illustrated in FIG. 1 through FIG. 5, and the bottom tier semiconductor die 100D2 are fabricated by the processes illustrated in FIG. 19 through FIG. 23. In some embodiments, a face-to-back bonding process is performed to bond the top tier semiconductor die 100A1 with the bottom tier semiconductor die 100D2. A bonding interface between the top tier semiconductor die 100A1 and the bottom tier semiconductor die 100D2 may include dielectric-to-dielectric bonding interfaces and metal-to-metal bonding interfaces. In some embodiments, a chip-to-wafer bonding process is performed to bond the singulated top tier semiconductor die 100A1 with the bottom tier semiconductor die 100D2 in the semiconductor wafer W4, wherein the singulated top tier semiconductor die 100A1 is fabricated by the processes illustrated in FIG. 1 through FIG. 6, and the bottom tier semiconductor dies 100D2 in the semiconductor wafer W4 are fabricated by the processes illustrated in FIG. 19 through FIG. 23. In some other embodiments, a wafer-to-wafer bonding process is performed to bond the top tier semiconductor die 100A1 in the semiconductor wafer W1 with the bottom tier semiconductor die 100D2 in the semiconductor wafer W4, wherein the top tier semiconductor die 100A1 in the semiconductor wafer W1 are fabricated by the processes illustrated in FIG. 1 through FIG. 5, and the bottom tier semiconductor dies 100D2 in the semiconductor wafer W4 are fabricated by the processes illustrated in FIG. 19 through FIG. 23. In FIG. 25H, the patterned bonding dielectric layers of the top tier semiconductor die 100A1 and the bottom tier semiconductor dies 100D2 provide a bonding interface with good thermal conductivity to dissipate heat effectively. Accordingly, hot spot issue occurred in the SoIC component illustrated in FIG. 25H may be solved.

Figure 25I:
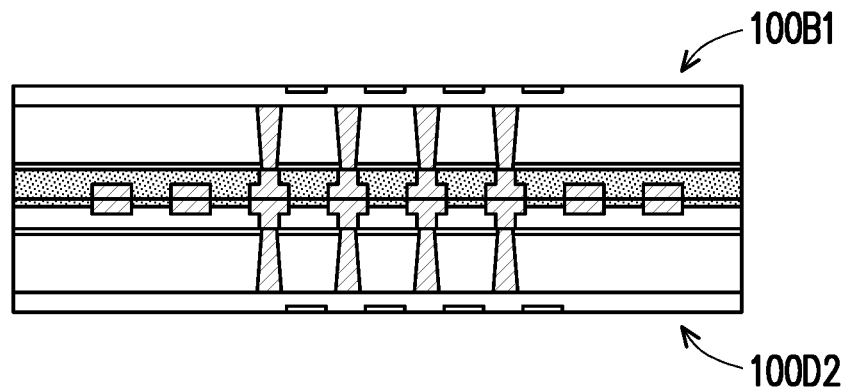

Referring to FIG. 25I, an SoIC component including a top tier semiconductor die 100B1 and a bottom tier semiconductor die 100D2 is provided. The top tier semiconductor die 100B1 are fabricated by the processes illustrated in FIG. 7 through FIG. 11, and the bottom tier semiconductor die 100D2 are fabricated by the processes illustrated in FIG. 19 through FIG. 23. In some embodiments, a face-to-back bonding process is performed to bond the top tier semiconductor die 100B1 with the bottom tier semiconductor die 100D2. A bonding interface between the top tier semiconductor die 100B1 and the bottom tier semiconductor die 100D2 may include dielectric-to-dielectric bonding interfaces and metal-to-metal bonding interfaces. In some embodiments, a chip-to-wafer bonding process is performed to bond the singulated top tier semiconductor die 100B1 with the bottom tier semiconductor die 100D2 in the semiconductor wafer W4, wherein the singulated top tier semiconductor die 100B1 is fabricated by the processes illustrated in FIG. 7 through FIG. 12, and the bottom tier semiconductor dies 100D2 in the semiconductor wafer W4 are fabricated by the processes illustrated in FIG. 19 through FIG. 23. In some other embodiments, a wafer-to-wafer bonding process is performed to bond the top tier semiconductor die 100B1 in the semiconductor wafer W2 with the bottom tier semiconductor die 100D2 in the semiconductor wafer W4, wherein the top tier semiconductor die 100B1 in the semiconductor wafer W2 are fabricated by the processes illustrated in FIG. 7 through FIG. 11, and the bottom tier semiconductor dies 100D2 in the semiconductor wafer W4 are fabricated by the processes illustrated in FIG. 19 through FIG. 23. In FIG. 25I, the patterned bonding dielectric layers of the top tier semiconductor die 100B1 and the bottom tier semiconductor dies 100D2 provide a bonding interface with good thermal conductivity to dissipate heat effectively. Accordingly, hot spot issue occurred in the SoIC component illustrated in FIG. 25I may be solved.

Figure 25J:
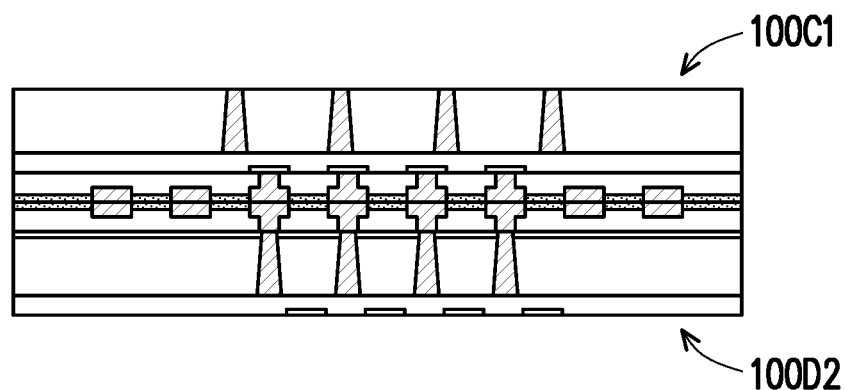

Referring to FIG. 25J, an SoIC component including a top tier semiconductor die 100C1 and a bottom tier semiconductor die 100D2 is provided. The top tier semiconductor die 100C1 are fabricated by the processes illustrated in FIG. 13 through FIG. 17, and the bottom tier semiconductor die 100D2 are fabricated by the processes illustrated in FIG. 19 through FIG. 23. In some embodiments, a face-to-back bonding process is performed to bond the top tier semiconductor die 100C1 with the bottom tier semiconductor die 100D2. A bonding interface between the top tier semiconductor die 100C1 and the bottom tier semiconductor die 100D2 may include dielectric-to-dielectric bonding interfaces and metal-to-metal bonding interfaces. In some embodiments, a chip-to-wafer bonding process is performed to bond the singulated top tier semiconductor die 100C1 with the bottom tier semiconductor die 100D2 in the semiconductor wafer W4, wherein the singulated top tier semiconductor die 100C1 is fabricated by the processes illustrated in FIG. 13 through FIG. 18, and the bottom tier semiconductor dies 100D2 in the semiconductor wafer W4 are fabricated by the processes illustrated in FIG. 19 through FIG. 23. In some other embodiments, a wafer-to-wafer bonding process is performed to bond the top tier semiconductor die 100C1 in the semiconductor wafer W3 with the bottom tier semiconductor die 100D2 in the semiconductor wafer W4, wherein the top tier semiconductor die 100C1 in the semiconductor wafer W3 are fabricated by the processes illustrated in FIG. 13 through FIG. 17, and the bottom tier semiconductor dies 100D2 in the semiconductor wafer W4 are fabricated by the processes illustrated in FIG. 19 through FIG. 23. In FIG. 25J, the patterned bonding dielectric layers of the top tier semiconductor die 100C1 and the bottom tier semiconductor dies 100D2 provide a bonding interface with good thermal conductivity to dissipate heat effectively. Accordingly, hot spot issue occurred in the SoIC component illustrated in FIG. 25J may be solved.

FIG. 26A through FIG. 26F are cross-sectional views schematically illustrating various integrated fan-out packages in accordance with some embodiments of the present disclosure.

Figure 26A:
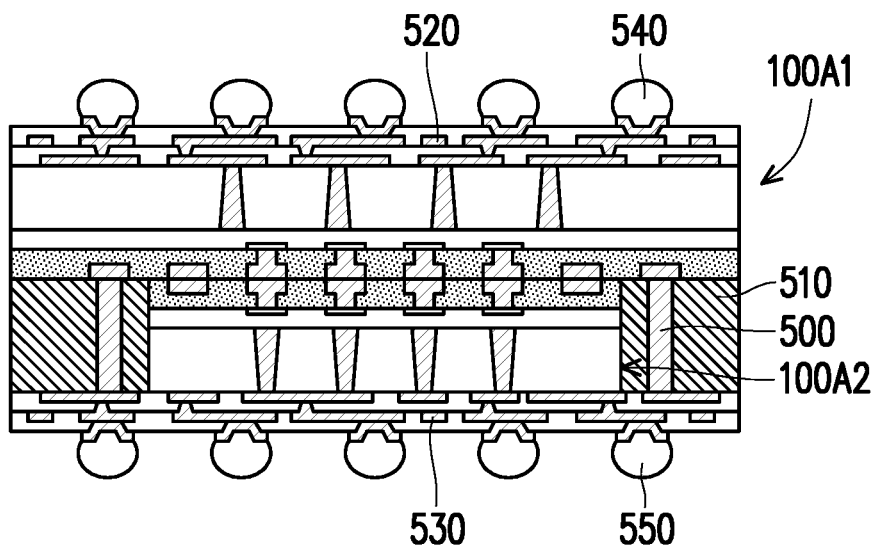
FIG. 26A through FIG. 26F are cross-sectional views schematically illustrating various integrated fan-out packages in accordance with some embodiments of the present disclosure.

Referring to FIG. 26A, an integrated fan-out package including a semiconductor die 100A1, a semiconductor die 100A2, conductive pillars 500, an insulating encapsulation 510, a first redistribution circuit structure 520, a second redistribution circuit structure 530, conductive terminals 540 and conductive terminals 550 is provided. The semiconductor dies 100A1 and 100A2 are bonded to each other through a face-to-face bonding process, and the lateral dimension (e.g., width) of the semiconductor die 100A1 is greater than that of the semiconductor die 100A2. The conductive pillars 500 are disposed on a front surface of the semiconductor die 100A1 and electrically connected to semiconductor die 100A1. The insulating encapsulation 510 covers the front surface of the semiconductor die 100A1 and laterally encapsulates the semiconductor die 100A2 and the conductive pillars 500. The first redistribution circuit structure 520 is disposed on a back surface of the semiconductor die 100A1 and electrically connected to the through semiconductor vias in the semiconductor die 100A1. The second redistribution circuit structure 530 is disposed on a surface of the insulating encapsulation 510 and a back surface of the semiconductor die 100A2, wherein the second redistribution circuit structure 530 is electrically connected to the semiconductor die 100A1 through the conductive pillars 500, and the second redistribution circuit structure 530 is electrically connected to the through semiconductor vias in the semiconductor die 100A2. The conductive terminals 540 are disposed on and electrically connected to the first redistribution circuit structure 520, and the conductive terminals 550 are disposed on and electrically connected to the second redistribution circuit structure 530. In FIG. 26A, the patterned bonding dielectric layers of the semiconductor die 100A1 and the semiconductor die 100A2 provide a bonding interface with good thermal conductivity to dissipate heat effectively. Accordingly, hot spot issue occurred in the SoIC component illustrated in FIG. 26A may be solved.

The integrated fan-out package illustrated in FIG. 26A may be fabricated by followings processes. A semiconductor wafer including semiconductor dies 100A1 is provided, and conductive pillars 500 are formed on the semiconductor dies 100A1 of the semiconductor wafer. The semiconductor wafer including semiconductor dies 100A1 may be the semiconductor wafer W1 illustrated in FIG. 5. Semiconductor dies 100A2 are bonded to the semiconductor dies 100A1 of the semiconductor wafer through a chip-to-wafer bonding process, for example. The semiconductor dies 100A2 may be the semiconductor dies 100A illustrated in FIG. 6. An insulating encapsulation 510 is formed over the semiconductor wafer including the semiconductor dies 100A1 to laterally encapsulate the semiconductor dies 100A2 and the conductive pillars 500. In some embodiments, the insulating encapsulation 510 is formed by a molding process or a deposition process followed by a grinding process. After forming the insulating encapsulation 510, the first redistribution circuit structure 520 and conductive terminals 540 are formed over a back surface of the semiconductor dies 100A1, and the second redistribution circuit structure 530 and conductive terminals 550 are formed on a back surface of the semiconductor dies 100A2 and a surface of the insulating encapsulation 500. Thereafter, a wafer sawing process may be performed to obtain the integrated fan-out package illustrated in FIG. 26A.

Figure 26B:
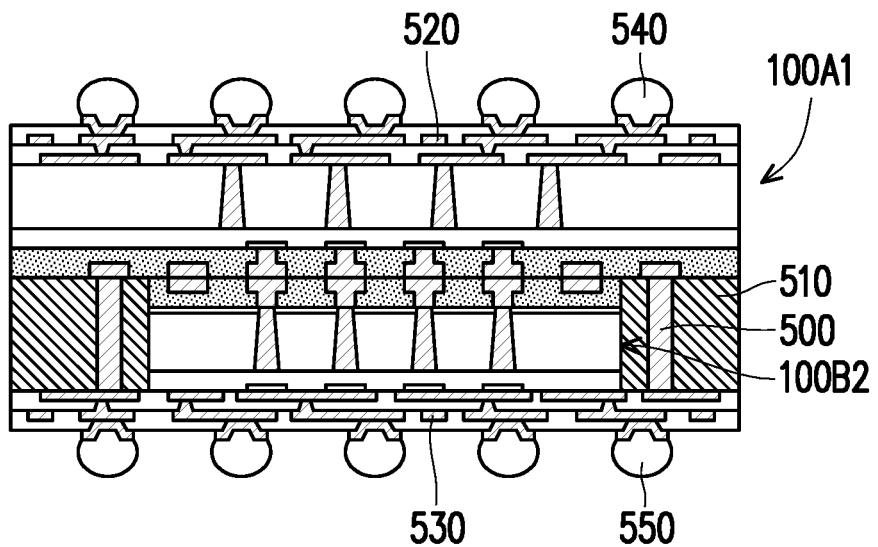

Referring to FIG. 26B, an integrated fan-out package including a semiconductor die 100A1, a semiconductor die 100B2, conductive pillars 500, an insulating encapsulation 510, a first redistribution circuit structure 520, a second redistribution circuit structure 530, conductive terminals 540 and conductive terminals 550 is provided. The semiconductor dies 100A1 and 100B2 are bonded to each other through a face-to-back bonding process, and the lateral dimension (e.g., width) of the semiconductor die 100A1 is greater than that of the semiconductor die 100B2. The conductive pillars 500 are disposed on a front surface of the semiconductor dies 100A1 and electrically connected to semiconductor dies 100A1. The insulating encapsulation 510 covers the front surface of the semiconductor die 100A and laterally encapsulates the semiconductor die 100A1 and the conductive pillars. The first redistribution circuit structure 520 is disposed on a back surface of the semiconductor die 100A1 and electrically connected to the through semiconductor vias in the semiconductor die 100A1. The second redistribution circuit structure 530 is disposed on a surface of the insulating encapsulation 510 and a back surface of the semiconductor die 100B2, wherein the second redistribution circuit structure 530 is electrically connected to the semiconductor die 100A1 through the conductive pillars 500, and the second redistribution circuit structure 530 is electrically connected to the semiconductor die 100B2. The conductive terminals 540 are disposed on and electrically connected to the first redistribution circuit structure 520, and the conductive terminals 550 are disposed on and electrically connected to the second redistribution circuit structure 530. In FIG. 26B, the patterned bonding dielectric layers of the semiconductor die 100A1 and the semiconductor die 100B2 provide a bonding interface with good thermal conductivity to dissipate heat effectively. Accordingly, hot spot issue occurred in the SoIC component illustrated in FIG. 26B may be solved.

The integrated fan-out package illustrated in FIG. 26B may be fabricated by followings processes. A semiconductor wafer including semiconductor dies 100A1 is provided, and conductive pillars 500 are formed on the semiconductor dies 100A1 of the semiconductor wafer. The semiconductor wafer including semiconductor dies 100A1 may be the semiconductor wafer W1 illustrated in FIG. 5. Semiconductor dies 100B2 are bonded to the semiconductor dies 100A1 of the semiconductor wafer through a chip-to-wafer bonding process, for example. The semiconductor dies 100B2 may be the semiconductor dies 100B illustrated in FIG. 12. An insulating encapsulation 510 is formed over the semiconductor wafer including the semiconductor dies 100A1 to laterally encapsulate the semiconductor dies 100B2 and the conductive pillars 500. In some embodiments, the insulating encapsulation 510 is formed by a molding process or a deposition process followed by a grinding process. After forming the insulating encapsulation 510, the first redistribution circuit structure 520 and conductive terminals 540 are formed over a back surface of the semiconductor dies 100A1, and the second redistribution circuit structure 530 and conductive terminals 550 are formed on a front surface of the semiconductor dies 100B2 and a surface of the insulating encapsulation 510. Thereafter, a wafer sawing process may be performed to obtain the integrated fan-out package illustrated in FIG. 26B.

The SoIC components of the integrated fan-out packages shown in FIG. 26A and FIG. 26B are merely illustration, the integrated fan-out package may include other types of SoIC components. For example, the integrated fan-out package may include at least one SoIC component among the SoIC components shown in FIG. 25A through FIG. 25J.

Figure 26C:
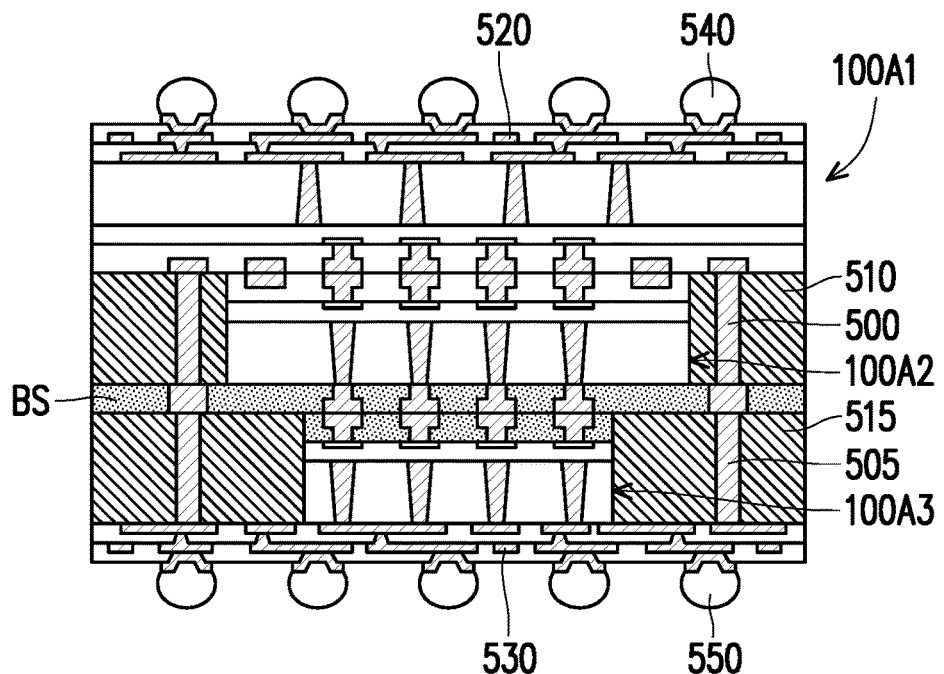

Referring to FIG. 26C, an integrated fan-out package including a semiconductor die 100A1, a semiconductor die 100A2, a semiconductor die 100A3, conductive pillars 500, conductive pillars 505, an insulating encapsulation 510, an insulating encapsulation 515, a bonding structure BS, a first redistribution circuit structure 520, a second redistribution circuit structure 530, conductive terminals 540 and conductive terminals 550 is provided. The semiconductor dies 100A1 and 100A2 are bonded to each other through a face-to-face bonding process, and the lateral dimension (e.g., width) of the semiconductor die 100A1 is greater than that of the semiconductor die 100A2. The semiconductor dies 100A2 and 100A3 are bonded to each other through a face-to-back bonding process, and the lateral dimension (e.g., width) of the semiconductor die 100A2 is greater than that of the semiconductor die 100A3. The conductive pillars

500 are disposed on a front surface of the semiconductor dies 100A1 and electrically connected to semiconductor dies 100A1. The insulating encapsulation 510 covers the front surface of the semiconductor die 100A1 and laterally encapsulates the semiconductor die 100A2 and the conductive pillars 500. The bonding structure BS is disposed on a back surface of the semiconductor dies 100A2 and a surface of the insulating encapsulation 510. The bonding structure BS is electrically connected to the conductive pillars 500 and through semiconductor vias in the semiconductor dies 100A2. The semiconductor die 100A3 and the conductive pillars 505 are disposed on and electrically connected to the bonding structure BS. The insulating encapsulation 515 covers the bonding structure BS and laterally encapsulates the semiconductor die 100A3 and the conductive pillars 505. The first redistribution circuit structure 520 is disposed on a back surface of the semiconductor die 100A1 and electrically connected to the through semiconductor vias in the semiconductor die 100A1. The second redistribution circuit structure 530 is disposed on a surface of the insulating encapsulation 515 and a back surface of the semiconductor die 100A3, wherein the second redistribution circuit structure 530 is electrically connected to the semiconductor die 100A1 through the conductive pillars 500, the conductive pillars 505 and the bonding structure BS. Furthermore, the second redistribution circuit structure 530 is electrically connected to the through semiconductor vias in the semiconductor die 100A3. The conductive terminals 540 are disposed on and electrically connected to the first redistribution circuit structure 520, and the conductive terminals 550 are disposed on and electrically connected to the second redistribution circuit structure 530. In FIG. 26C, the patterned bonding dielectric layers of the semiconductor die 100A1, the semiconductor die 100A2 and the semiconductor die 100A3 provide bonding interfaces with good thermal conductivity to dissipate heat effectively. Accordingly, hot spot issue occurred in the SoIC component illustrated in FIG. 26C may be solved.

The integrated fan-out package illustrated in FIG. 26C may be fabricated by followings processes. A semiconductor wafer including semiconductor dies 100A1 is provided, and conductive pillars 500 are formed on the semiconductor dies 100A1 of the semiconductor wafer. The semiconductor wafer including semiconductor dies 100A1 may be the semiconductor wafer W1 illustrated in FIG. 5. Semiconductor dies 100A2 are bonded to the semiconductor dies 100A1 of the semiconductor wafer through a chip-to-wafer bonding process, for example. The semiconductor dies 100A2 may be the semiconductor dies 100A illustrated in FIG. 6. An insulating encapsulation 510 is formed over the semiconductor wafer including the semiconductor dies 100A1 to laterally encapsulate the semiconductor dies 100A2 and the conductive pillars 500. In some embodiments, the insulating encapsulation 510 is formed by a molding process or a deposition process followed by a grinding process. After forming the insulating encapsulation 510, a bonding structure BS is formed to cover a back surface of the semiconductor dies 100A2 and a surface of the insulating encapsulation 510. Conductive pillars 505 are formed on the bonding structure BS and semiconductor dies 100A3 are bonded to the bonding structure BS. The semiconductor dies 100A3 may be the semiconductor dies 100A illustrated in FIG. 6, and the lateral dimension of the semiconductor dies 100A2 may be greater than that of the semiconductor dies 100A3. An insulating encapsulation 515 is formed over the bonding structure BS to laterally encapsulate the semiconductor dies 100A3 and the conductive pillars 505. In some embodiments, the insulating encapsulation 515 is formed by a molding process or a deposition process followed by a grinding process. After forming the insulating encapsulation 515, the first redistribution circuit structure 520 and conductive terminals 540 are formed over a back surface of the semiconductor dies 100A1, and the second redistribution circuit structure 530 and conductive terminals 550 are formed on a back surface of the semiconductor dies 100A3 and a surface of the insulating encapsulation 515. Thereafter, a wafer sawing process may be performed to obtain the integrated fan-out package illustrated in FIG. 26C.

Figure 26D:
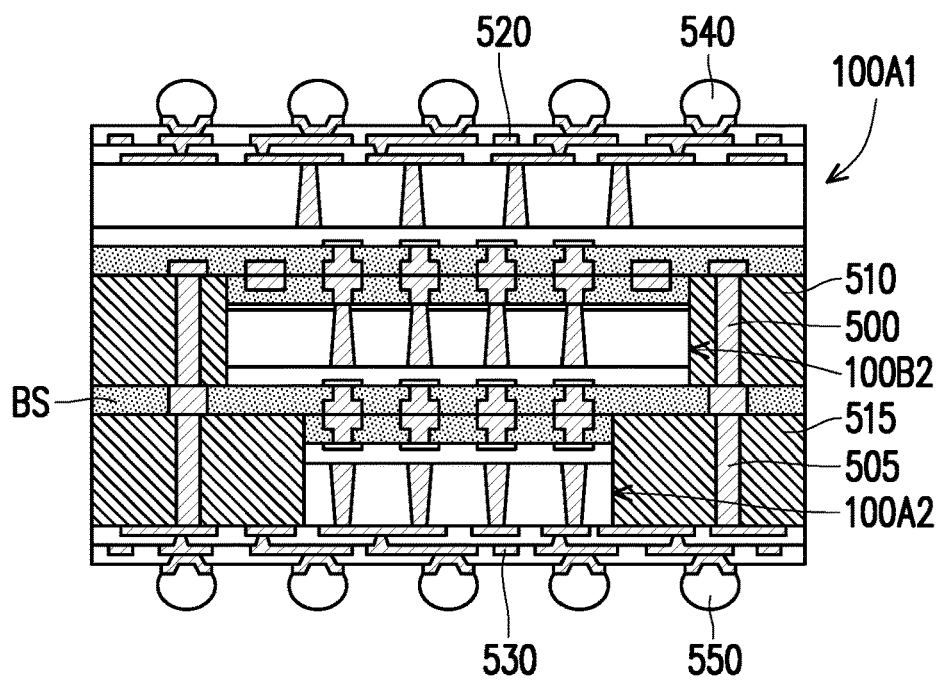

Referring to FIG. 26D, an integrated fan-out package including a semiconductor die 100A1, a semiconductor die 100B2, a semiconductor die 100A2, conductive pillars 500, conductive pillars 505, an insulating encapsulation 510, an insulating encapsulation 515, a bonding structure BS, a first redistribution circuit structure 520, a second redistribution circuit structure 530, conductive terminals 540 and conductive terminals 550 is provided. The semiconductor dies 100A1 and 100B2 are bonded to each other through a face-to-back bonding process, and the lateral dimension (e.g., width) of the semiconductor die 100A1 is greater than that of the semiconductor die 100B2. The semiconductor dies 100B2 and 100A2 are bonded to each other through a face-to-face bonding process, and the lateral dimension (e.g., width) of the semiconductor die 100B2 is greater than that of the semiconductor die 100A2. The conductive pillars 500 are disposed on a front surface of the semiconductor dies 100A1 and electrically connected to semiconductor dies 100A1. The insulating encapsulation 510 covers the front surface of the semiconductor die 100A1 and laterally encapsulates the semiconductor die 100B2 and the conductive pillars 500. The bonding structure BS is disposed on a back surface of the semiconductor dies 100B2 and a surface of the insulating encapsulation 510. The bonding structure BS is electrically connected to the conductive pillars 500 and through semiconductor vias in the semiconductor dies 100B2. The semiconductor die 100A2 and the conductive pillars 505 are disposed on and electrically connected to the bonding structure BS. The insulating encapsulation 515 covers the bonding structure BS and laterally encapsulates the semiconductor die 100A2 and the conductive pillars 505. The first redistribution circuit structure 520 is disposed on a back surface of the semiconductor die 100A1 and electrically connected to the through semiconductor vias in the semiconductor die 100A1. The second redistribution circuit structure 530 is disposed on a surface of the insulating encapsulation 515 and a back surface of the semiconductor die 100A2, wherein the second redistribution circuit structure 530 is electrically connected to the semiconductor die 100A1 through the conductive pillars 500, the conductive pillars 505 and the bonding structure BS. Furthermore, the second redistribution circuit structure 530 is electrically connected to the through semiconductor vias in the semiconductor die 100A2. The conductive terminals 540 are disposed on and electrically connected to the first redistribution circuit structure 520, and the conductive terminals 550 are disposed on and electrically connected to the second redistribution circuit structure 530. In FIG. 26D, the patterned bonding dielectric layers of the semiconductor die 100A1, the semiconductor die 100B2 and the semiconductor die 100A2 provide bonding interfaces with good thermal conductivity to dissipate heat effectively. Accordingly, hot spot issue occurred in the SoIC component illustrated in FIG. 26D may be solved.

The integrated fan-out package illustrated in FIG. 26D may be fabricated by followings processes. A semiconductor wafer including semiconductor dies 100A1 is provided, and conductive pillars 500 are formed on the semiconductor dies 100A1 of the semiconductor wafer. The semiconductor wafer including semiconductor dies 100A1 may be the semiconductor wafer W1 illustrated in FIG. 5. Semiconductor dies 100B2 are bonded to the semiconductor dies 100A1 of the semiconductor wafer through a chip-to-wafer bonding process, for example. The semiconductor dies 100B2 may be the semiconductor dies 100B illustrated in FIG. 12. An insulating encapsulation 510 is formed over the semiconductor wafer including the semiconductor dies 100A1 to laterally encapsulate the semiconductor dies 100B2 and the conductive pillars 500. In some embodiments, the insulating encapsulation 510 is formed by a molding process or a deposition process followed by a grinding process. After forming the insulating encapsulation 510, a bonding structure BS is formed to cover a back surface of the semiconductor dies 100B2 and a surface of the insulating encapsulation 510. Conductive pillars 505 are formed on the bonding structure BS, and semiconductor dies 100A2 are bonded to the bonding structure BS. The semiconductor dies 100A2 may be the semiconductor dies 100A illustrated in FIG. 6, and the lateral dimension of the semiconductor dies 100B2 may be greater than that of the semiconductor dies 100A2. An insulating encapsulation 515 is formed over the bonding structure BS to laterally encapsulate the semiconductor dies 100A2 and the conductive pillars 505. In some embodiments, the insulating encapsulation 515 is formed by a molding process or a deposition process followed by a grinding process. After forming the insulating encapsulation 515, the first redistribution circuit structure 520 and conductive terminals 540 are formed over a back surface of the semiconductor dies 100A1, and the second redistribution circuit structure 530 and conductive terminals 550 are formed on a back surface of the semiconductor dies 100A2 and a surface of the insulating encapsulation 515. Thereafter, a wafer sawing process may be performed to obtain the integrated fan-out package illustrated in FIG. 26D.

Figure 26E:
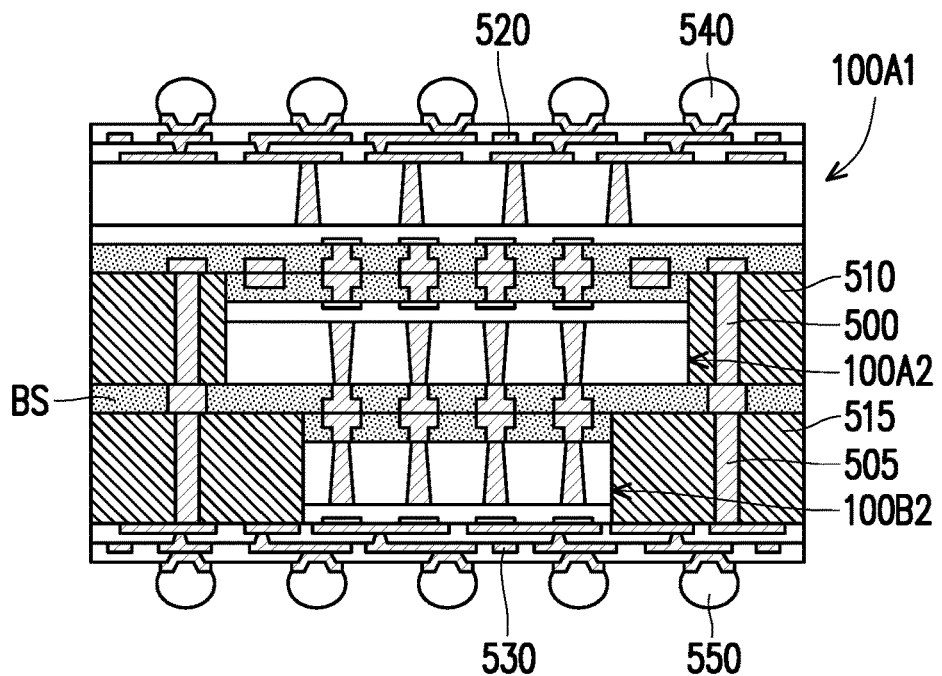

Referring to FIG. 26E, an integrated fan-out package including a semiconductor die 100A1, a semiconductor die 100A2, a semiconductor die 100B2, conductive pillars 500, conductive pillars 505, an insulating encapsulation 510, an insulating encapsulation 515, a bonding structure BS, a first redistribution circuit structure 520, a second redistribution circuit structure 530, conductive terminals 540 and conductive terminals 550 is provided. The semiconductor dies 100A1 and 100A2 are bonded to each other through a face-to-face bonding process, and the lateral dimension (e.g., width) of the semiconductor die 100A1 is greater than that of the semiconductor die 100A2. The semiconductor dies 100A2 and 100B2 are bonded to each other through a back-to-back bonding process, and the lateral dimension (e.g., width) of the semiconductor die 100A2 is greater than that of the semiconductor die 100B2. The conductive pillars 500 are disposed on a front surface of the semiconductor dies 100A1 and electrically connected to semiconductor dies 100A1. The insulating encapsulation 510 covers the front surface of the semiconductor die 100A1 and laterally encapsulates the semiconductor die 100A2 and the conductive pillars 500. The bonding structure BS is disposed on a back surface of the semiconductor dies 100A2 and a surface of the insulating encapsulation 510. The bonding structure BS is electrically connected to the conductive pillars 500 and through semiconductor vias in the semiconductor dies 100A2. The semiconductor die 100B2 and the conductive pillars 505 are disposed on and electrically connected to the bonding structure BS. The insulating encapsulation 515 covers the bonding structure BS and laterally encapsulates the semiconductor die 100B2 and the conductive pillars 505. The first redistribution circuit structure 520 is disposed on a back surface of the semiconductor die 100A1 and electrically connected to the through semiconductor vias in the semiconductor die 100A1. The second redistribution circuit structure 530 is disposed on a surface of the insulating encapsulation 515 and a front surface of the semiconductor die 100B2, wherein the second redistribution circuit structure 530 is electrically connected to the semiconductor die 100A1 through the conductive pillars 500, the conductive pillars 505 and the bonding structure BS. Furthermore, the second redistribution circuit structure 530 is electrically connected to the semiconductor die 100B2. The conductive terminals 540 are disposed on and electrically connected to the first redistribution circuit structure 520, and the conductive terminals 550 are disposed on and electrically connected to the second redistribution circuit structure 530. In FIG. 26E, the patterned bonding dielectric layers of the semiconductor die 100A1, the semiconductor die 100A2 and the semiconductor die 100B2 provide bonding interfaces with good thermal conductivity to dissipate heat effectively. Accordingly, hot spot issue occurred in the SoIC component illustrated in FIG. 26E may be solved.

The integrated fan-out package illustrated in FIG. 26E may be fabricated by followings processes. A semiconductor wafer including semiconductor dies 100A1 is provided, and conductive pillars 500 are formed on the semiconductor dies 100A1 of the semiconductor wafer. The semiconductor wafer including semiconductor dies 100A1 may be the semiconductor wafer W1 illustrated in FIG. 5. Semiconductor dies 100A2 are bonded to the semiconductor dies 100A1 of the semiconductor wafer through a chip-to-wafer bonding process, for example. The semiconductor dies 100A2 may be the semiconductor dies 100A illustrated in FIG. 6. An insulating encapsulation 510 is formed over the semiconductor wafer including the semiconductor dies 100A1 to laterally encapsulate the semiconductor dies 100A2 and the conductive pillars 500. In some embodiments, the insulating encapsulation 510 is formed by a molding process or a deposition process followed by a grinding process. After forming the insulating encapsulation 510, a bonding structure BS is formed to cover a back surface of the semiconductor dies 100A2 and a surface of the insulating encapsulation 510. Conductive pillars 505 are formed on the bonding structure BS and semiconductor dies 100B2 are bonded to the bonding structure BS. The semiconductor dies 100B2 may be the semiconductor dies 100B illustrated in FIG. 12, and the lateral dimension of the semiconductor dies 100A2 may be greater than that of the semiconductor dies 100B2. An insulating encapsulation 515 is formed over the bonding structure BS to laterally encapsulate the semiconductor dies 100B2 and the conductive pillars 505. In some embodiments, the insulating encapsulation 515 is formed by a molding process or a deposition process followed by a grinding process. After forming the insulating encapsulation 515, the first redistribution circuit structure 520 and conductive terminals 540 are formed over a back surface of the semiconductor dies 100A1, and the second redistribution circuit structure 530 and conductive terminals 550 are formed on a front surface of the semiconductor dies 100B2 and a surface of the insulating encapsulation 515. Thereafter, a wafer sawing process may be performed to obtain the integrated fan-out package illustrated in FIG. 26E.

Figure 26F:
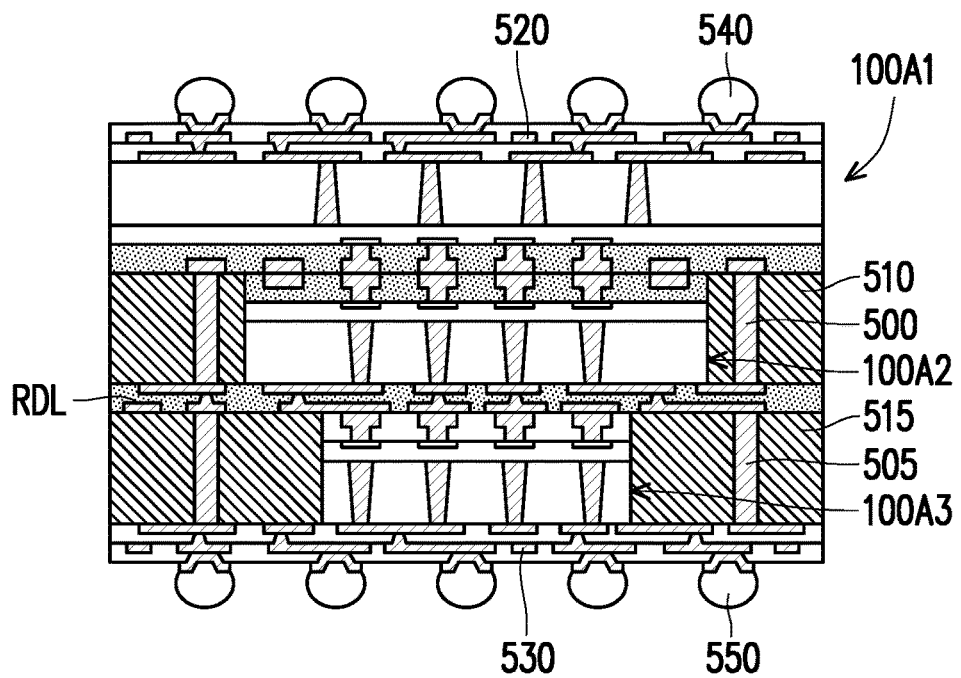

Referring to FIG. 26F, an integrated fan-out package including a semiconductor die 100A1, a semiconductor die 100A2, a semiconductor die 100A3, conductive pillars 500, conductive pillars 505, an insulating encapsulation 510, an insulating encapsulation 515, a redistribution circuit structure RDL, a first redistribution circuit structure 520, a second redistribution circuit structure 530, conductive terminals 540 and conductive terminals 550 is provided. The semiconductor dies 100A1 and 100A2 are bonded to each other through a face-to-face bonding process, and the lateral dimension (e.g., width) of the semiconductor die 100A1 is greater than that of the semiconductor die 100A2. The semiconductor dies 100A2 and 100A3 are bonded to each other through a face-to-back bonding process, and the lateral dimension (e.g., width) of the semiconductor die 100A2 is greater than that of the semiconductor die 100A3. The conductive pillars 500 are disposed on a front surface of the semiconductor dies 100A1 and electrically connected to semiconductor dies 100A1. The insulating encapsulation 510 covers the front surface of the semiconductor die 100A1 and laterally encapsulates the semiconductor die 100A2 and the conductive pillars 500. The redistribution circuit structure RDL is disposed on a back surface of the semiconductor dies 100A2 and a surface of the insulating encapsulation 510. The redistribution circuit structure RDL is electrically connected to the conductive pillars 500 and through semiconductor vias in the semiconductor dies 100A2. The semiconductor die 100A3 and the conductive pillars 505 are disposed on and electrically connected to the redistribution circuit structure RDL. The insulating encapsulation 515 covers the redistribution circuit structure RDL and laterally encapsulates the semiconductor die 100A3 and the conductive pillars 505. The first redistribution circuit structure 520 is disposed on a back surface of the semiconductor die 100A1 and electrically connected to the through semiconductor vias in the semiconductor die 100A1. The second redistribution circuit structure 530 is disposed on a surface of the insulating encapsulation 515 and a back surface of the semiconductor die 100A3, wherein the second redistribution circuit structure 530 is electrically connected to the semiconductor die 100A1 through the conductive pillars 500, the conductive pillars 505 and the redistribution circuit structure RDL. Furthermore, the second redistribution circuit structure 530 is electrically connected to the through semiconductor vias in the semiconductor die 100A3. The conductive terminals 540 are disposed on and electrically connected to the first redistribution circuit structure 520, and the conductive terminals 550 are disposed on and electrically connected to the second redistribution circuit structure 530. In FIG. 26F, the redistribution circuit structure RDL as well as the patterned bonding dielectric layers of the semiconductor die 100A1, the semiconductor die 100A2 and the semiconductor die 100A3 provide bonding interfaces with good thermal conductivity to dissipate heat effectively. Accordingly, hot spot issue occurred in the SoIC component illustrated in FIG. 26F may be solved.

The integrated fan-out package illustrated in FIG. 26F may be fabricated by followings processes. A semiconductor wafer including semiconductor dies 100A1 is provided, and conductive pillars 500 are formed on the semiconductor dies 100A1 of the semiconductor wafer. The semiconductor wafer including semiconductor dies 100A1 may be the semiconductor wafer W1 illustrated in FIG. 5. Semiconductor dies 100A2 are bonded to the semiconductor dies 100A1 of the semiconductor wafer through a chip-to-wafer bonding process, for example. The semiconductor dies 100A2 may be the semiconductor dies 100A illustrated in FIG. 6. An insulating encapsulation 510 is formed over the semiconductor wafer including the semiconductor dies 100A1 to laterally encapsulate the semiconductor dies 100A2 and the conductive pillars 500. In some embodiments, the insulating encapsulation 510 is formed by a molding process or a deposition process followed by a grinding process. After forming the insulating encapsulation 510, a redistribution circuit structure RDL is formed to cover a back surface of the semiconductor dies 100A2 and a surface of the insulating encapsulation 510. Conductive pillars 505 are formed on the redistribution circuit structure RDL and semiconductor dies 100A3 are bonded to the redistribution circuit structure RDL. The semiconductor dies 100A3 may be the semiconductor dies 100A illustrated in FIG. 6, and the lateral dimension of the semiconductor dies 100A2 may be greater than that of the semiconductor dies 100A3. An insulating encapsulation 515 is formed over the redistribution circuit structure RDL to laterally encapsulate the semiconductor dies 100A3 and the conductive pillars 505. In some embodiments, the insulating encapsulation 515 is formed by a molding process or a deposition process followed by a grinding process. After forming the insulating encapsulation 515, the first redistribution circuit structure 520 and conductive terminals 540 are formed over a back surface of the semiconductor dies 100A1, and the second redistribution circuit structure 530 and conductive terminals 550 are formed on a back surface of the semiconductor dies 100A3 and a surface of the insulating encapsulation 515. Thereafter, a wafer sawing process may be performed to obtain the integrated fan-out package illustrated in FIG. 26F.

Figure 27:
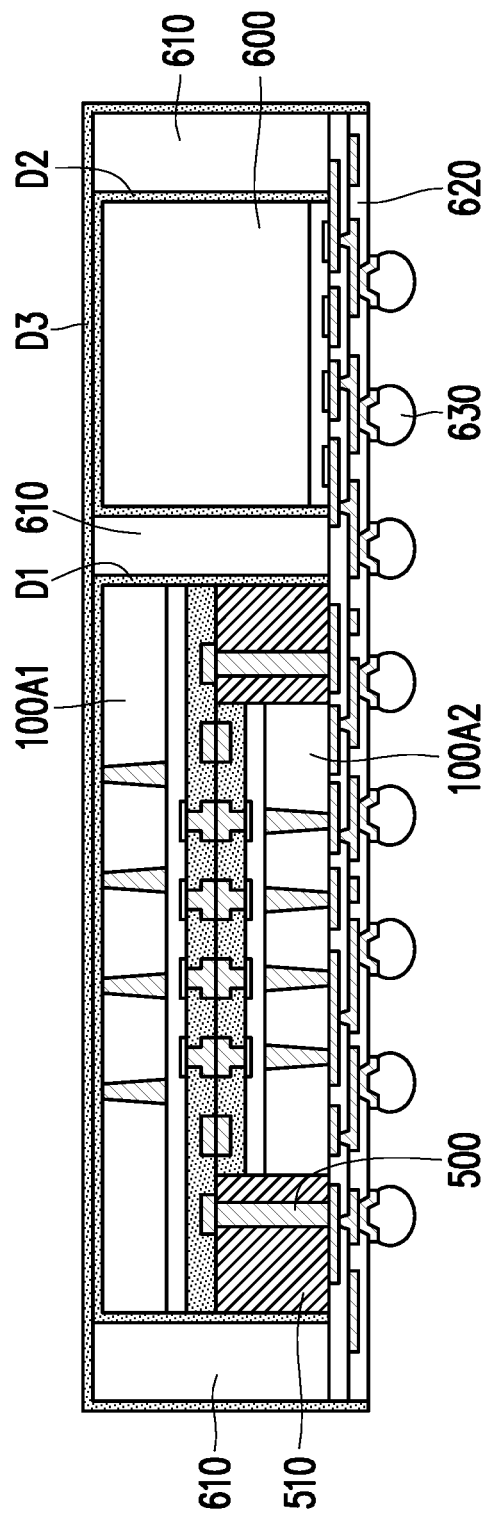
FIG. 27 and FIG. 28 are cross-sectional views schematically illustrating various package structures in accordance with some other embodiments of the present disclosure.
Figure 28:
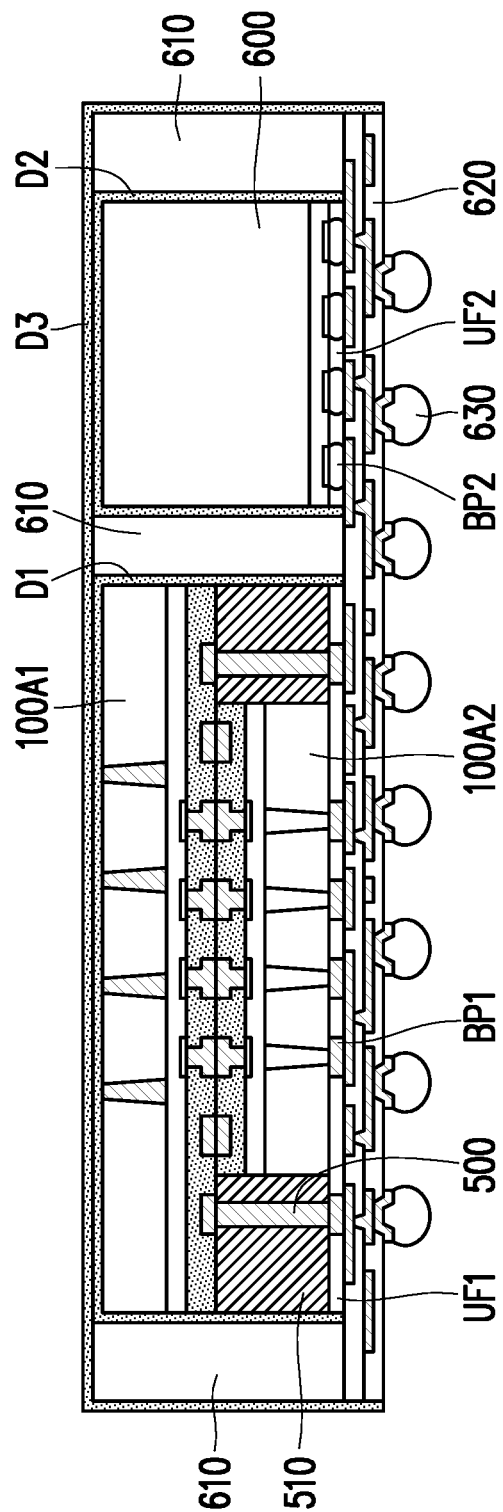

FIG. 27 and FIG. 28 are cross-sectional views schematically illustrating various package structures in accordance with some other embodiments of the present disclosure.

Referring to FIG. 27, an integrated fan-out package including a semiconductor die 100A1, a semiconductor die 100A2, conductive pillars 500, an insulating encapsulation 510, dielectric cover D1, a semiconductor device 600, a dielectric cover D2, an insulating encapsulation 610, a dielectric cover D3, a redistribution circuit structure 620 and conductive terminals 630 is provided. The semiconductor dies 100A1 and 100A2 are bonded to each other through a face-to-face bonding process, and the lateral dimension (e.g., width) of the semiconductor die 100A1 is greater than that of the semiconductor die 100A2. The conductive pillars 500 are disposed on a front surface of the semiconductor dies 100A1 and electrically connected to semiconductor dies 100A1. The insulating encapsulation 510 covers the front surface of the semiconductor die 100A and laterally encapsulates the semiconductor die 100A1 and the conductive pillars 500. The dielectric cover D1 may conformally cover the back surface of the semiconductor die 100A, side surfaces of the semiconductor die 100A and side surface of the insulating encapsulation 510. The semiconductor device 600 may be a high bandwidth memory (HBM) device disposed aside the bonded structure of the semiconductor dies 100A1 and 100A2. A back surface and side surfaces of the semiconductor device 600 may be covered by the dielectric cover D2. The semiconductor device 600 and the bonded structure of the semiconductor dies 100A1 and 100A2 may be laterally encapsulated by the insulating encapsulation 610. In some embodiments, as illustrated in FIG. 27, the bonded structure of the semiconductor dies 100A1 and 100A2 is spaced apart from the insulating encapsulation 610 by the dielectric cover D1, and the semiconductor device 600 is spaced apart from the insulating encapsulation 610 by the dielectric cover D2. The redistribution circuit structure 620 and the conductive terminals 630 are disposed on bottom surfaces of the insulating encapsulation 610, the semiconductor device 600 and the bonded structure of the semiconductor dies 100A1 and 100A2. The redistribution circuit structure 620 and the conductive terminals 630 are electrically connected to the semiconductor device 600, the semiconductor die 100A1, and the semiconductor die 100A2. Furthermore, the dielectric cover D3 may cover the insulating encapsulation 610, a portion of the dielectric cover D1, a portion of the dielectric cover D2 and side surfaces of the redistribution circuit structure 620.

The above-mentioned dielectric covers D1, D2 and D3 may be dielectric layers having thermal conductivity greater than that of silicon dioxide. For example, the thermal conductivity of the dielectric covers D1, D2 and D3 is greater than about 1.4 W/mK. The dielectric covers D1, D2 and D3 may be a diamond like carbon (DLC) layer or other suitable dielectric layers having thermal conductivity greater than about 1.4 W/mK. For example, the thermal conductivity of the dielectric covers D1, D2 and D3 is greater than about 1.4 W/mK and less than about 3.5 W/mK.

The package structure illustrated in FIG. 27 may be fabricated by an RDL first process or a chip first process (i.e. an RDL last process).

In the RDL first process, the redistribution circuit structure 620 may be formed over a carrier (not shown), and the semiconductor device 600 and the bonded structure of the semiconductor dies 100A1 and 100A2 may be mounted on the redistribution circuit structure 620 carried by the carrier. After the semiconductor device 600 and the bonded structure of the semiconductor dies 100A1 and 100A2 are mounted on the redistribution circuit structure 620, the dielectric covers D1 and D2 may be form to cover the semiconductor device 600 and the bonded structure of the semiconductor dies 100A1 and 100A2. In some embodiments, the dielectric covers D1 and D2 may be formed simultaneously. The dielectric covers D1 and D2 may be connected to each other or spaced apart from each other. After forming the dielectric covers D1 and D2, the insulating encapsulation 610 may be formed to laterally encapsulate the semiconductor device 600 and the bonded structure of the semiconductor dies 100A1 and 100A2 by a molding process or a deposition process followed by a grinding process. After forming the insulating encapsulation 610, the redistribution circuit structure 620 and the conductive terminals 630 are formed on bottom surfaces of the insulating encapsulation 610, the semiconductor device 600 and the bonded structure of the semiconductor dies 100A1 and 100A2. A wafer sawing process may be performed to obtain multiple singulated package structures. Thereafter, the dielectric cover D3 is formed to cover the insulating encapsulation 610, a portion of the dielectric cover D1, a portion of the dielectric cover D2 and side surfaces of the redistribution circuit structure 620.

In the chip first process (i.e. an RDL last process), the semiconductor device 600 and the bonded structure of the semiconductor dies 100A1 and 100A2 may be picked-up and placed on a carrier (not shown) first. After the semiconductor device 600 and the bonded structure of the semiconductor dies 100A1 and 100A2 are placed on the carrier, the dielectric covers D1 and D2 may be form to cover the semiconductor device 600 and the bonded structure of the semiconductor dies 100A1 and 100A2. In some embodiments, the dielectric covers D1 and D2 may be formed simultaneously. The dielectric covers D1 and D2 may be connected to each other or spaced apart from each other. After forming the dielectric covers D1 and D2, the insulating encapsulation 610 may be formed to laterally encapsulate the semiconductor device 600 and the bonded structure of the semiconductor dies 100A1 and 100A2 by a molding process or a deposition process followed by a grinding process. After forming the insulating encapsulation 610, the semiconductor device 600 and the bonded structure of the semiconductor dies 100A1 and 100A2 which are encapsulated by the insulating encapsulation 610 are de-bonded from the carrier, and the redistribution circuit structure 620 and the conductive terminals 630 are formed on bottom surfaces of the insulating encapsulation 610, the semiconductor device 600 and the bonded structure of the semiconductor dies 100A1 and 100A2. A wafer sawing process may be performed to obtain multiple singulated package structures. Thereafter, the dielectric cover D3 is formed to cover the insulating encapsulation 610, a portion of the dielectric cover D1, a portion of the dielectric cover D2 and side surfaces of the redistribution circuit structure 620.

Referring to FIG. 27 and FIG. 28, the package structure illustrated in FIG. 28 is similar to the package structure illustrated in FIG. 27 except that the semiconductor die 100A2 and the semiconductor device 600 are electrically connected to the redistribution circuit structure 620 by conductive bumps BP1 and BP2 encapsulated by underfills UF1 and UF2, respectively.

In the embodiments illustrated in FIG. 27 and FIG. 28, the dielectric covers D1, D2 and D3 may enhance heat dissipation performance of package structures. Furthermore, the patterned bonding dielectric layers of the semiconductor die 100A1 and the semiconductor dies 100A2 provide a bonding interface with good thermal conductivity to dissipate heat effectively. Accordingly, hot spot issue occurred between the semiconductor die 100A1 and the semiconductor dies 100A2 may be solved.

In accordance with some embodiments of the disclosure, a structure including a first semiconductor die and a second semiconductor die is provided. The first semiconductor die includes a first bonding structure. The first bonding structure includes a first dielectric layer and first conductors embedded in the first dielectric layer. The second semiconductor die includes a second bonding structure. The second bonding structure includes a second dielectric layer and second conductors embedded in the second dielectric layer. The first dielectric layer is in contact with the second dielectric layer, and the first conductors are in contact with the second conductors. Thermal conductivity of the first dielectric layer and the second dielectric layer is greater than thermal conductivity of silicon dioxide. In some embodiments, thermal conductivity of the first dielectric layer and the second dielectric layer is greater than 1.4 W/mK. In some embodiments, the first dielectric layer and the second dielectric layer are substantially identical in material. In some embodiments, the first dielectric layer and the second dielectric layer includes a diamond like carbon (DLC) layer. In some embodiments, the first semiconductor die includes a first semiconductor substrate and a first interconnect structure on the first semiconductor substrate, the first conductors are electrically connected to the first interconnect structure, and the first dielectric layer covers the first interconnect structure; and the second semiconductor die includes a second semiconductor substrate and a second interconnect structure on the second semiconductor substrate, the second conductors are electrically connected to the second interconnect structure, and the second dielectric layer covers the second interconnect structure. In some embodiments, the first semiconductor die includes a first semiconductor substrate and a first interconnect structure on the first semiconductor substrate, the first conductors are electrically connected to the first interconnect structure, and the first dielectric layer covers the first interconnect structure; the second semiconductor die includes a second semiconductor substrate, through vias penetrating through the second semiconductor substrate, and a second interconnect structure on a first surface of the second semiconductor substrate; and the second conductors and the second dielectric layer are disposed on a second surface the second semiconductor substrate, the second surface is opposite to the first surface, and the second conductors are electrically connected to the second interconnect structure by the through vias.

In accordance with some other embodiments of the disclosure, a structure including a first semiconductor die and a second semiconductor die is provided. The first semiconductor die includes a first bonding structure. The first bonding structure includes a first dielectric layer and first conductors embedded in the first dielectric layer. The second semiconductor die includes a second bonding structure. The second bonding structure includes a second dielectric layer, a third dielectric layer covering the second dielectric layer, and second conductors embedded in the second and third dielectric layer. The first dielectric layer is in contact with the third dielectric layer. The first conductors are in contact with the second conductors, wherein thermal conductivity of the first and second dielectric layer is greater than thermal conductivity of the third dielectric layer. In some embodiments, thermal conductivity of the first dielectric layer and the second dielectric layer is greater than 1.4 W/mK, and thermal conductivity of the third dielectric layer is greater than 1.2 W/mK and less than 1.4 W/mK. In some embodiments, the first dielectric layer is spaced apart from the second dielectric layer by the second dielectric layer. In some embodiments, the first dielectric layer and the second dielectric layer includes a diamond like carbon (DLC) layer. In some embodiments, the first semiconductor die includes a first semiconductor substrate and a first interconnect structure on the first semiconductor substrate, the first conductors are electrically connected to the first interconnect structure, and the first dielectric layer covers the first interconnect structure; and the second semiconductor die includes a second semiconductor substrate and a second interconnect structure on the second semiconductor substrate, the second conductors are electrically connected to the second interconnect structure, and the second dielectric layer and the third dielectric layer cover the second interconnect structure. In some embodiments, the first semiconductor die includes a first semiconductor substrate and a first interconnect structure on the first semiconductor substrate, the first conductors are electrically connected to the first interconnect structure, and the first dielectric layer covers the first interconnect structure; the second semiconductor die is stacked over the first semiconductor die; the second semiconductor die includes a second semiconductor substrate, through vias penetrating through the second semiconductor substrate, and a second interconnect structure on a first surface of the second semiconductor substrate; and the second conductors, the second dielectric layer, and the third dielectric layer are disposed on a second surface the second semiconductor substrate, the second surface is opposite to the first surface, and the second conductors are electrically connected to the second interconnect structure by the through vias. In some embodiments, the first dielectric layer and the second dielectric layer are thicker than the third dielectric layer.

In accordance with some other embodiments of the disclosure, a structure including a first semiconductor die and a second semiconductor die is provided. The first semiconductor die includes a first bonding structure. The first bonding structure includes a first dielectric layer, a second dielectric layer covering the first dielectric layer, and first conductors embedded in the first dielectric layer and the second dielectric layer. The second semiconductor die includes a second bonding structure. The second bonding structure includes a third dielectric layer, a fourth dielectric layer covering the third dielectric layer, and second conductors embedded in the third dielectric layer and the fourth dielectric layer. The second dielectric layer is in contact with the fourth dielectric layer. The first conductors are in contact with the second conductors, wherein thermal conductivity of the first dielectric layer and the third dielectric layer is greater than thermal conductivity of second dielectric layer and the fourth dielectric layer. In some embodiments, thermal conductivity of the first dielectric layer and the third dielectric layer is greater than 1.4 W/mK, and thermal conductivity of the third dielectric layer and the fourth dielectric layer is greater than 1.2 W/mK and less than 1.4 W/mK. In some embodiments, the first dielectric layer is spaced apart from the third dielectric layer by the second and fourth dielectric layers. In some embodiments, the first dielectric layer and the third dielectric layer includes a diamond like carbon (DLC) layer, and the second dielectric layer and the fourth dielectric layer includes silicon dioxide. In some embodiments, the first semiconductor die includes a first semiconductor substrate and a first interconnect structure on the first semiconductor substrate, the first conductors are electrically connected to the first interconnect structure, and the first dielectric layer and the second dielectric layer cover the first interconnect structure; and the second semiconductor die includes a second semiconductor substrate and a second interconnect structure on the second semiconductor substrate, the second conductors are electrically connected to the second interconnect structure, and the third dielectric layer and the fourth dielectric layer cover the second interconnect structure. In some embodiments, the first semiconductor die includes a first semiconductor substrate and a first interconnect structure on the first semiconductor substrate, the first conductors are electrically connected to the first interconnect structure, and the first dielectric layer and the second dielectric layer cover the first interconnect structure; the second semiconductor die is stacked over the first semiconductor die; the second semiconductor die includes a second semiconductor substrate, through vias penetrating through the second semiconductor substrate, and a second interconnect structure on a first surface of the second semiconductor substrate; and the second conductors, the second dielectric layer, and the third dielectric layer are disposed on a second surface the second semiconductor substrate, the second surface is opposite to the first surface, and the second conductors are electrically connected to the second interconnect structure by the through vias. In some embodiments, the first dielectric layer and the third dielectric layer are thicker than the second dielectric layer and the fourth dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
    a first semiconductor die comprising:
        a semiconductor substrate;
        through vias penetrating through the semiconductor substrate;
        an interconnect structure; and
        a bonding structure, wherein the interconnect structure and the bonding structure are disposed on opposite surfaces of the semiconductor substrate, the bonding structure is electrically connected to the interconnect structure by the through vias, thermal conductivity of at least one dielectric layer of the bonding structure is greater than thermal conductivity of silicon dioxide.

2. The structure as claimed in claim 1, wherein the thermal conductivity of the dielectric layer is greater than 1.4 W/mK.

3. The structure as claimed in claim 1, wherein the thermal conductivity of the at least one dielectric layer of the bonding structure is greater than thermal conductivity of the rest dielectric layers of the bonding structure.

4. The structure as claimed in claim 1, wherein the at least one dielectric layer comprises a diamond like carbon (DLC) layer.

5. The structure as claimed in claim 1 further comprising a second semiconductor die bonded to the first semiconductor die, wherein sidewalls of the first semiconductor die laterally offset from sidewalls of the second semiconductor die.

6. The structure as claimed in claim 1 further comprising a second semiconductor die bonded to the first semiconductor die, wherein sidewalls of the first semiconductor die are substantially aligned with sidewalls of the second semiconductor die.

7. A structure, comprising:
    a first semiconductor die, comprising:
        a semiconductor substrate;
        through vias penetrating through the semiconductor substrate;
        an interconnect structure; and
        a bonding structure, wherein the interconnect structure and the bonding structure are disposed on opposite surfaces of the semiconductor substrate, the bonding structure is electrically connected to the interconnect structure by the through vias, the bonding structure comprises at least one inner dielectric layer and an outer dielectric layer covering the at least one inner dielectric layer, and thermal conductivity of the at least one inner dielectric layer is greater than thermal conductivity of the outer dielectric layer.

8. The structure as claimed in claim 7, wherein the thermal conductivity of the at least one inner dielectric layer is greater than 1.4 W/mK, and the thermal conductivity of the outer dielectric layer is greater than 1.2 W/mK and less than 1.4 W/mK.

9. The structure as claimed in claim 7, wherein the at least one inner dielectric layer is in contact with the outer dielectric layer.

10. The structure as claimed in claim 7, wherein the at least one inner dielectric layer comprises a diamond like carbon (DLC) layer.

11. The structure as claimed in claim 7 further comprising a second semiconductor die bonded to the first semiconductor die, wherein sidewalls of the first semiconductor die laterally offset from sidewalls of the second semiconductor die.

12. The structure as claimed in claim 7 further comprising a second semiconductor die bonded to the first semiconductor die, wherein sidewalls of the first semiconductor die are substantially aligned with sidewalls of the second semiconductor die.

13. The structure as claimed in claim 7 further comprising a second semiconductor die bonded to the first semiconductor die, wherein the second semiconductor die comprises a bonding dielectric layer bonded to the outer dielectric layer, and the bonding dielectric layer and the at least one inner dielectric layer are thicker than the outer dielectric layer.

14. A structure, comprising:
    a first semiconductor die comprising a first semiconductor substrate, a first interconnect structure and a first bonding structure, the first bonding structure comprising a first inner dielectric layer and a first outer dielectric layer covering the first inner dielectric layer; and
    a second semiconductor die stacked over the first semiconductor die, the second semiconductor die comprising a second semiconductor substrate, through vias penetrating through the second semiconductor substrate, a second interconnect structure, and a second bonding structure, the second bonding structure comprising a second inner dielectric layer, a second outer dielectric layer covering the second inner dielectric layer, the first outer dielectric layer being in contact with the second outer dielectric layer, wherein thermal conductivity of at least one of the first inner dielectric layer and the second inner dielectric layer is greater than thermal conductivity of at least one of the first outer dielectric layer and the second outer dielectric layer, and
    wherein the first inner dielectric layer is spaced apart from the second inner dielectric layer by the first outer dielectric layer and the second outer dielectric layer.

15. The structure as claimed in claim 14, wherein the thermal conductivity of the at least one of the first inner dielectric layer and the second inner dielectric layer is greater than 1.4 W/mK, and the thermal conductivity of the at least one of the first outer dielectric layer and the second outer dielectric layer is greater than 1.2 W/mK and less than 1.4 W/mK.

16. The structure as claimed in claim 14, wherein the second interconnect structure and the second bonding structure are disposed on opposite surfaces of the second semiconductor substrate.

17. The structure as claimed in claim 14, wherein the first inner dielectric layer and the second inner dielectric layer comprises a diamond like carbon (DLC) layer, and the first outer dielectric layer and the second outer dielectric layer comprises silicon dioxide.

18. The structure as claimed in claim 14, wherein sidewalls of the first semiconductor die laterally offset from sidewalls of the second semiconductor die.

19. The structure as claimed in claim 14, wherein sidewalls of the first semiconductor die are substantially aligned with sidewalls of the second semiconductor die.

20. The structure as claimed in claim 14, wherein the first inner dielectric layer and the second inner dielectric layer are thicker than the first outer dielectric layer and the second outer dielectric layer.

* * * * *